US009818879B2

(12) United States Patent
Park et al.

(10) Patent No.: US 9,818,879 B2
(45) Date of Patent: Nov. 14, 2017

(54) INTEGRATED CIRCUIT DEVICES

(71) Applicant: Samsung Electronics Co., Ltd., Suwon-Si, Gyeonggi-do (KR)

(72) Inventors: Yong-hee Park, Hwaseong-si (KR); Young-seok Song, Hwaseong-si (KR); Ji-soo Chang, Seoul (KR); Young-chul Hwang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 50 days.

(21) Appl. No.: 14/807,912

(22) Filed: Jul. 24, 2015

(65) Prior Publication Data

US 2016/0079354 A1    Mar. 17, 2016

(30) Foreign Application Priority Data

Sep. 17, 2014 (KR) .................. 10-2014-0123715

(51) Int. Cl.
  *H01L 29/78* (2006.01)
  *H01L 27/088* (2006.01)
  *H01L 27/092* (2006.01)
  *H01L 29/66* (2006.01)
  *H01L 21/8234* (2006.01)

(52) U.S. Cl.
  CPC ...... *H01L 29/7856* (2013.01); *H01L 27/0886* (2013.01); *H01L 27/0924* (2013.01); *H01L 29/66545* (2013.01); *H01L 21/823431* (2013.01); *H01L 21/823437* (2013.01)

(58) Field of Classification Search
  CPC .................................................. H01L 29/7856
  See application file for complete search history.

(56) References Cited

U.S. PATENT DOCUMENTS

| 7,569,897 | B2 | 8/2009 | Anderson et al. |
| 8,138,030 | B2 | 3/2012 | Chang et al. |
| 8,629,007 | B2 | 1/2014 | Haran et al. |
| 8,637,384 | B2 | 1/2014 | Ando et al. |
| 8,697,539 | B2 | 4/2014 | Huang et al. |
| 2008/0296702 | A1* | 12/2008 | Lee ................. H01L 21/823431 257/401 |
| 2013/0181263 | A1 | 7/2013 | Cai et al. |
| 2014/0061734 | A1 | 3/2014 | Basker et al. |
| 2014/0070320 | A1 | 3/2014 | Mukherjee et al. |
| 2014/0117455 | A1 | 5/2014 | Liu et al. |
| 2014/0264604 | A1* | 9/2014 | Tsai ...................... H01L 29/785 257/347 |

(Continued)

FOREIGN PATENT DOCUMENTS

JP    2006-013328    1/2006

*Primary Examiner* — Daniel Whalen
(74) *Attorney, Agent, or Firm* — Ward and Smith, P.A.

(57) ABSTRACT

An IC device includes a substrate including a device region having a fin-type active region and a deep trench region; a gate line that extends in a direction intersecting the fin-type active region; and an inter-device isolation layer that fills the deep trench region. The gate line includes a first gate portion that extends on the device region to cover the fin-type active region and has a flat upper surface at a first level and a second gate portion that extends on the deep trench region to cover the inter-device isolation layer while being integrally connected to the first gate portion and has an upper surface at a second level that is closer to the substrate than the first level.

22 Claims, 33 Drawing Sheets

(56) References Cited

U.S. PATENT DOCUMENTS

| | | | |
|---|---|---|---|
| 2014/0367798 A1* | 12/2014 | Kuo | H01L 21/76224 257/401 |
| 2015/0001468 A1* | 1/2015 | Huang | H01L 29/66977 257/24 |
| 2015/0162419 A1* | 6/2015 | Li | H01L 29/66545 438/585 |
| 2016/0190319 A1* | 6/2016 | Kavalieros | H01L 29/78 257/190 |

* cited by examiner

1B – 1B'

1C – 1C'

7B – 7B'

7C – 7C'

8B - 8B'

8C - 8C'

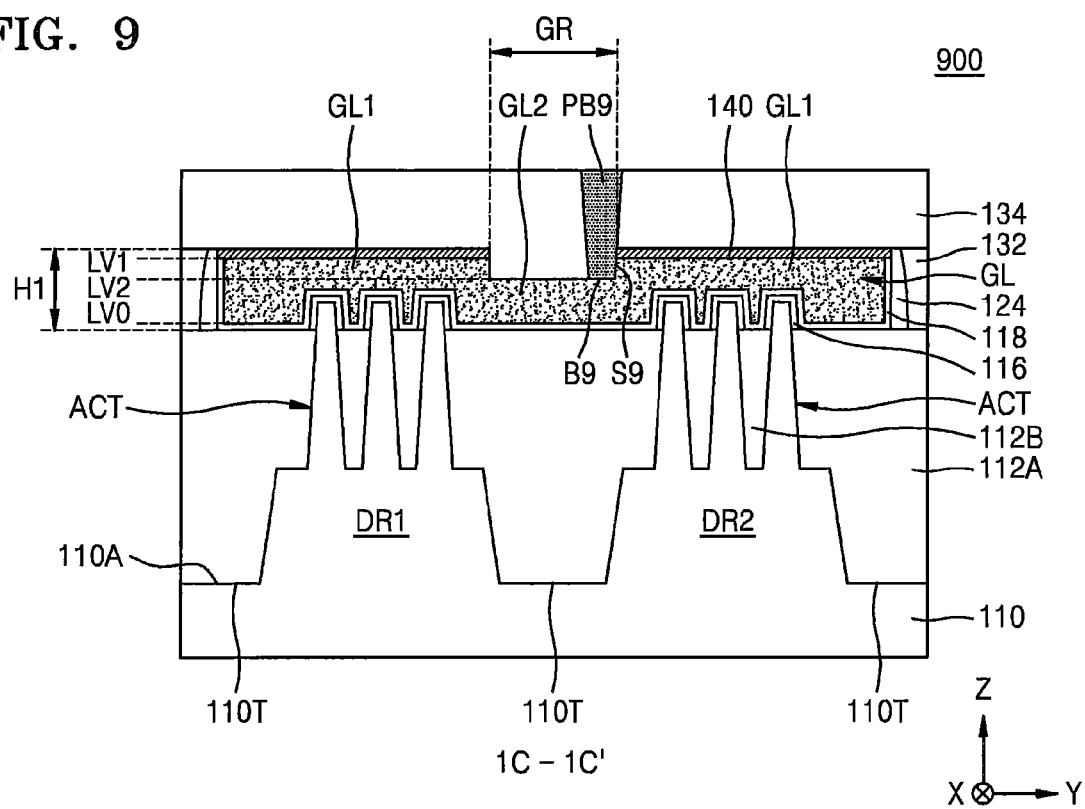

1B – 1B'

1C – 1C'

| ΔLV | 30 nm | 45 nm | 60 nm |
|---|---|---|---|
| 1 Fin | 7.0% | 10.0% | 12.9% |
| 2 Fins | 3.6% | 5.0% | 6.4% |
| 3 Fins | 1.8% | 2.5% | 3.1% |

INTEGRATED CIRCUIT DEVICES

CROSS-REFERENCE TO RELATED APPLICATIONS

This application claims the benefit of Korean Patent Application No. 10-2014-0123715, filed on Sep. 17, 2014, in the Korean Intellectual Property Office, the disclosure of which is incorporated herein in its entirety by reference.

BACKGROUND

As IC devices become more highly integrated and gate lengths of field effect transistors (FETs) are reduced, efforts to develop a device including a FinFET having a channel of a three-dimensional (3D) structure have been made to overcome limitations of characteristics of a device having a planar metal oxide semiconductor FET (MOSFET). In addition, efforts to improve characteristics related to operation speed, power consumption, and economic efficiency have been made to improve the overall operation stability of transistors of IC devices.

SUMMARY

The inventive concept provides integrated circuit (IC) devices including transistors that may improve an operation speed and reduce power consumption by reducing parasitic capacitance.

The inventive concept provides methods of manufacturing an IC device including transistors that may improve an operation speed and reduce power consumption by reducing parasitic capacitance.

According to an aspect of the inventive concept, an integrated circuit (IC) device includes a substrate comprising a device region having at least one fin-type active region and a deep trench region for defining the device region, a gate line that extends, in a direction intersecting the at least one fin-type active region, on the device region and the deep trench region and an inter-device isolation layer that fills the deep trench region. Some embodiments provide that the gate line includes a first gate portion that extends on the device region to cover the at least one fin-type active region and has a flat upper surface at a first level and a second gate portion that extends on the deep trench region to cover the inter-device isolation layer while being integrally connected to the first gate portion and has an upper surface at a second level that is closer to the substrate than the first level.

In some embodiments, the deep trench region is spaced apart from the at least one fin-type active region.

Some embodiments include a device isolation layer that covers a lower portion of the at least one fin-type active region on the device region. In some embodiments, the first gate portion has a first thickness on the device isolation layer on the device region, and the second gate portion has a second thickness that is smaller than the first thickness on the inter-device region isolation layer on the deep trench region.

Some embodiments include an insulating capping layer that covers the gate line and provide that the insulating capping layer extends discontinuously to cover the first gate portion of the gate line and not to cover the second gate portion of the gate line.

Some embodiments include an insulating spacer that covers both sidewalls of the gate line on the device region and the deep trench region and provide that the insulating spacer has a first height on the device region and has a second height that is smaller than the first height on the deep trench region.

Some embodiments include a gate insulating layer that covers a bottom and both sidewalls of the gate line on the device region and the deep trench region and provide that an upper surface of the gate insulating layer is at a level that is different from a level of an upper surface of the second gate portion, on the deep trench region.

Some embodiments include a gate insulating layer that covers a bottom and both sidewalls of the gate line on the device region and the deep trench region and an insulating spacer that covers both sidewalls of the gate line with the gate insulating layer interposed therebetween on the device region and the deep trench region. In some embodiments, an upper surface of the gate insulating layer on the deep trench region is positioned at a lower level than an upper surface of the insulating spacer on the deep trench region.

Some embodiments provide that the insulating spacer has a first height on the device region and has a second height that is smaller than the first height on the deep trench region. Some embodiments include a first insulating capping layer that extends discontinuously on the gate line to cover the first gate portion of the gate line and not to cover the second gate portion of the gate line and provide that the insulating spacer covers both sidewalls of the gate line and both sidewalls of the first insulating capping layer, on the device region and the deep trench region.

Some embodiments provide a second insulating capping layer and provide that the second insulating capping layer includes a first portion that is spaced apart from the first gate portion with the first insulating capping layer interposed therebetween on the device region and a second portion that is integrally connected to the first portion and that contacts the second gate portion on the deep trench region.

Some embodiments include an insulating spacer that covers both sidewalls of the gate line on the device region and the deep trench region and provide that a height of the insulating spacer on the device region is the same as a height of the insulating spacer on the deep trench region. Some embodiments include an inter-gate insulating layer that covers both sidewalls of the gate line with the insulating spacer interposed therebetween on the device region and the deep trench region. In some embodiments, an upper surface of the insulating spacer is positioned at a level that is the same as a level of an upper surface of the inter-gate insulating layer, on the deep trench region.

Some embodiments include an insulating capping layer. In some embodiments, the insulating capping layer includes a first portion that contacts the first gate portion on the device region and a second portion that is integrally connected to the first portion and that contacts the second gate portion on the deep trench region.

Some embodiments include an interlayer insulating layer that covers the gate line on the device region and the deep trench region and an air space region that is between the second gate portion and the interlayer insulating layer.

In some embodiments, the first gate portion and the second gate portion in the gate line are repeatedly alternately disposed at least two times in a length direction of the gate line, and the gate line has an upper surface that has an uneven shape and extends in the length direction of the gate line.

Some embodiments according to the inventive concepts include an integrated circuit (IC) device that includes a substrate comprising a device region having at least one fin-type active region and an inter-device isolation region for defining the device region and a gate line that extends over the device region and the inter-device isolation region. In some embodiments, the gate line includes a first gate portion that extends on the device region to cover the at least one fin-type active region and that has a flat upper surface at a first level and a second gate portion that extends to cover the inter-device isolation region while being integrally connected to the first gate portion and that has an upper surface at a second level that is lower than the first level.

Some embodiments according to the inventive concept include methods of manufacturing an integrated circuit (IC) device. Such methods may include forming a conductive line on a substrate that includes a device region having an fin-type active region and a deep trench region that is configured to define the device region, the conductive line extending over the device region and the deep trench region and forming an uneven portion in an upper surface of the conductive line by removing a portion of the conductive line, positioned on the deep trench region, by a predetermined thickness from the upper surface of the conductive line so that a thickness of the conductive line in the device region is different from a thickness of the conductive line in the deep trench region.

In some embodiments, forming the conductive line comprises forming the conductive line to have a flat upper surface over the device region and the deep trench region.

Some embodiments of the inventive concept include methods of manufacturing an integrated circuit (IC) device. Such methods may include forming an insulating layer on a substrate that includes a device region having a fin-type active region and a deep trench region that is configured to define the device region, the insulating layer extending over a device region and a deep trench region and exposing the fin-type active region, forming a conductive line that extends on the insulating layer and the fin-type active region while intersecting the fin-type active region and that covers the device region and the deep trench region, and forming a gate line by removing a portion of the conductive line that is on the deep trench region by a predetermined thickness from an upper surface of the conductive line so that the gate line includes a first upper surface having a first level in the device region and a second upper surface having a second level that is closer to the substrate than the first level, in the deep trench region.

In some embodiments, forming the conductive line includes forming a dummy gate line on the insulating layer and the fin-type active region, forming an insulating spacer covering both sidewalls of the dummy gate line, forming a gate space that is defined by the insulating spacer, by removing the dummy gate line and forming the conductive line having a flattened upper surface in the gate space.

Some embodiments include after forming the conductive line, forming an insulating capping layer that covers the conductive line in the gate space and removing a portion of the insulating capping layer and a portion of the insulating spacer on the deep trench region before forming of the gate line and provide that, on the deep trench region, the second upper surface of the conductive line is exposed and a height of the insulating spacer is lowered and that forming the gate line comprises removing a portion of the conductive line by a predetermined thickness from the upper surface of the conductive line that is exposed on the deep trench region.

Some embodiments include forming an interlayer insulating layer on the gate line over the device region and the deep trench region and that defines an air space region on the second upper surface of the gate line.

Some embodiments of the inventive concept include an integrated circuit (IC) device that includes a substrate comprising a device region having at least one active region and an first device isolation layer for defining the device region, a second device isolation layer on the device region and covering a lower portion of the active region, a plurality of conductive lines that cover the active region on the second device isolation layer and that extend over the device region and the first device isolation layer in a direction intersecting the active region, at least one of the plurality of conductive lines comprising a first portion that extends on the device region to cover the active region and the second device isolation layer and has a first thickness on the second device isolation layer and a second portion that extends on the first device isolation layer, while being integrally connected to the first portion and has a second thickness that is smaller than the first thickness, on the first device isolation layer, and a first contact plug that is formed on the at least one of the plurality of conductive lines and is connected to the second portion.

Some embodiments include a second contact plug that is formed on the at least one of the plurality of conductive lines and is connected to the first portion and provide that the at least one conductive line is a gate line for forming a transistor and that a height of the first contact plug is greater than a height of the second contact plug. In some embodiments, each of the plurality of conductive lines has a bottom surface that evenly extends over the first device isolation layer, and an upper surface that has an uneven shape and extends in a length direction of the plurality of conductive lines.

Some embodiments provide that each of the plurality of conductive lines comprises a conductive line recess region that is spaced apart from the device region and that the second portion of the at least one of the plurality of conductive lines is at a position corresponding to the conductive line recess region.

Some embodiments include an insulating layer that covers a bottom and both sidewalls of the at least one of the plurality of conductive lines on the device region and the first device isolation layer and an insulating spacer that covers both sidewalls of the at least one of the plurality of conductive lines with the insulating layer interposed therebetween on the device region and the first device isolation layer. In some embodiments, a height of an upper surface of the insulating layer that is adjacent the second portion of the at least one of the plurality of conductive lines on the first device isolation layer is smaller than a height of an upper surface of the insulating spacer that is adjacent the first portion of the at least one of the plurality of conductive lines on the second device isolation layer.

Some embodiments include a first insulating capping layer that extends discontinuously on the at least one of the plurality of conductive lines to cover the first portion of the at least one of the plurality of conductive lines and not to cover the second portion of the at least one of the plurality of conductive lines. In some embodiments, the insulating spacer that covers both sidewalls of the at least one of the plurality of conductive lines and both sidewalls of the first insulating capping layer, on the device region.

In some embodiments, the first contact plug has a sidewall that contacts the first portion and a bottom that contacts the second portion.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

Example embodiments of the inventive concept will be more clearly understood from the following detailed description taken in conjunction with the accompanying drawings.

FIG. 9 is a cross-sectional view of an IC device according to other example embodiments.

DETAILED DESCRIPTION OF THE EMBODIMENTS

Figure 1A:
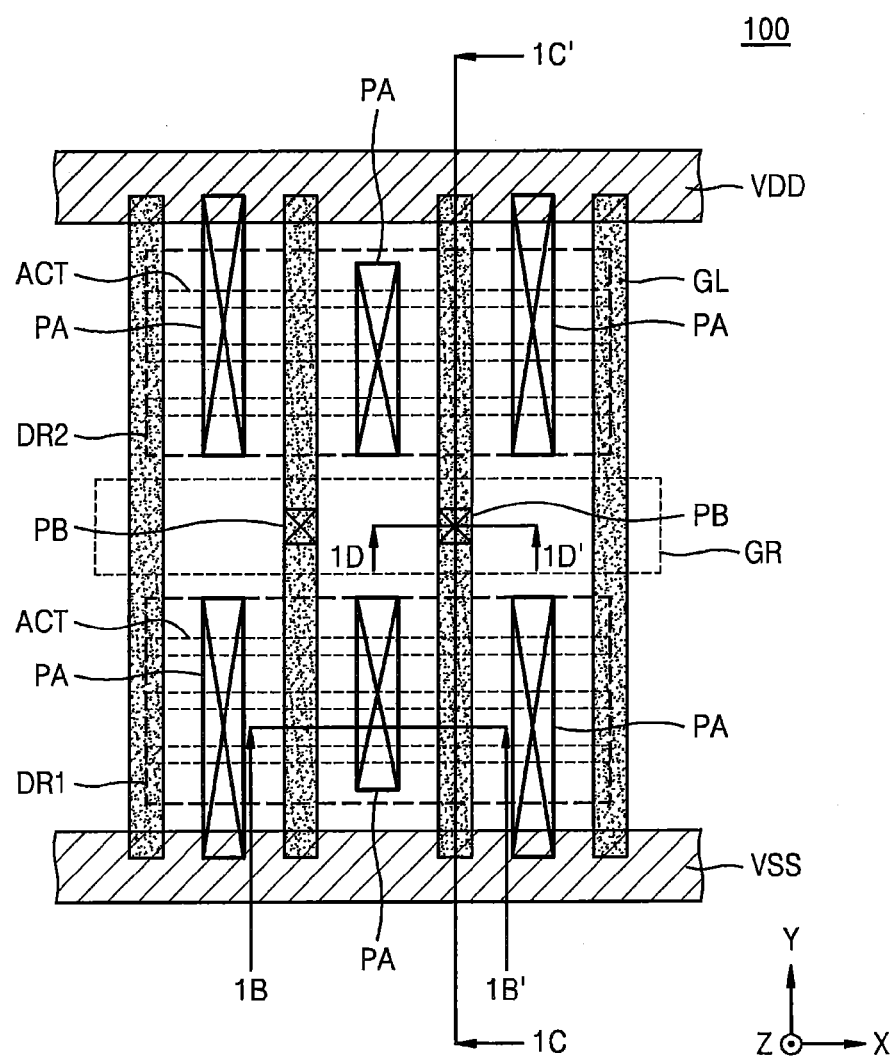
FIG. 1A is a layout diagram of an integrated circuit (IC) device according to some embodiments.

Hereinafter, example embodiments of the inventive concept will be described in detail with reference to the accompanying drawings. Like reference numerals in the drawings denote like elements, and thus their redundant description will be omitted.

The inventive concept will now be described more fully with reference to the accompanying drawings, in which example embodiments of the inventive concept are shown. The inventive concept may, however, be embodied in many different forms and should not be construed as being limited to the example embodiments set forth herein; rather, these example embodiments are provided so that this disclosure will be thorough and complete, and will fully convey the inventive concept to those of ordinary skill in the art.

It will be understood that although the terms "first", "second", etc. are used herein to describe members, regions, layers, portions, sections, components, and/or elements in example embodiments of the inventive concept, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concept. For example, a first element may also be referred to as a second element, and similarly, a second element may also be referred to as a first element, without departing from the scope of the inventive concept.

Unless otherwise defined, all terms (including technical and scientific terms) used herein have the same meaning as commonly understood by those of ordinary skill in the art to which the inventive concept pertains. It will also be understood that terms, such as those defined in commonly used dictionaries, should be interpreted as having a meaning that is consistent with their meaning in the context of the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the example embodiments of the inventive concept should not be construed as being limited to the particular shapes of regions illustrated herein but may be construed to include deviations in shapes that result, for example, from a manufacturing process.

Figure 1B:
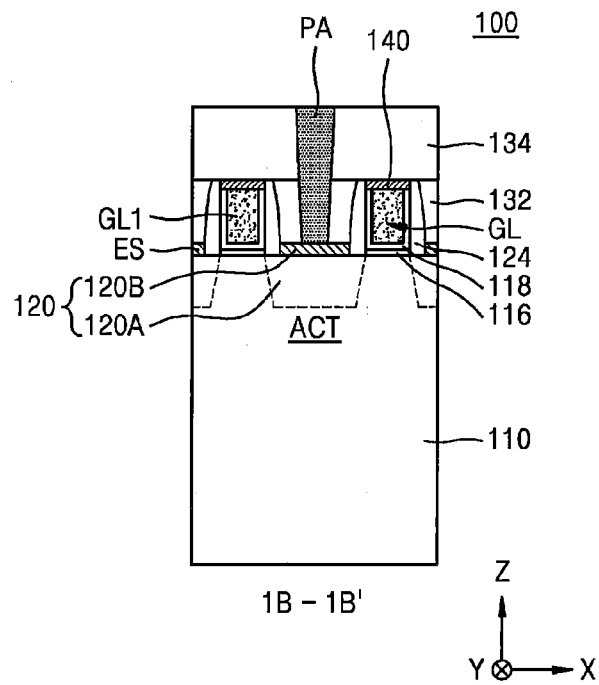
FIG. 1B is a cross-sectional view taken along line 1B-1B' of FIG. 1A.
Figure 1C:
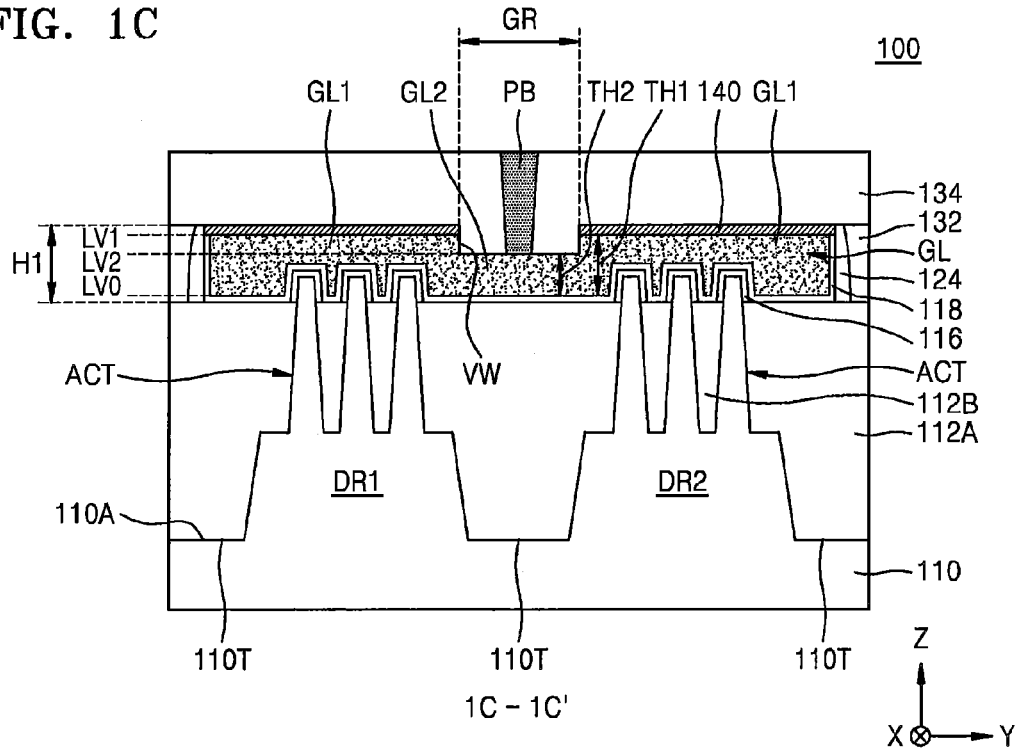
FIG. 1C is a cross-sectional view taken along line 1C-1C' of FIG. 1A.
Figure 1D:
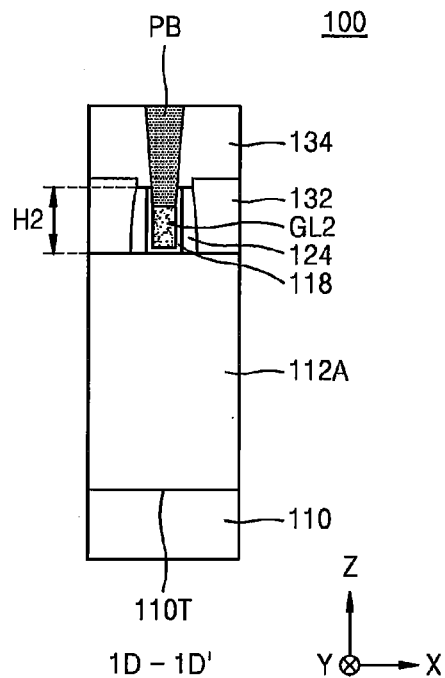
FIG. 1D is a cross-sectional view taken along line 1D-1D' of FIG. 1A.

FIGS. 1A through 1D are diagrams illustrating structures of essential parts of an integrated circuit (IC) device 100 according to example embodiments, and illustrates a portion of the IC device 100 including a fin field effect transistor (FinFET). More specifically, FIG. 1A is a layout diagram of the IC device 100. FIG. 1B is a cross-sectional view taken along line 1B-1B' of FIG. 1A, FIG. 1C is a cross-sectional view taken along line 1C-1C' of FIG. 1A, and FIG. 1D is a cross-sectional view taken along line 1D-1D' of FIG. 1A.

Referring to FIGS. 1A through 1D, a substrate 110, which has a main surface 110A extending in a horizontal direction (i.e., an X direction and a Y direction in FIG. 1), includes a first device region DR1 and a second device region DR2, in which a plurality of fin-type active regions ACT protruding from the substrate 110 are formed. Each of the first and second device regions DR1 and DR2 is defined by a deep trench region 110T formed in the substrate 110. The deep trench region 110T may be positioned to be spaced apart from the plurality of fin-type active regions ACT.

In some example embodiments, the substrate 110 may include a semiconductor, such as Si or Ge, or a compound semiconductor, such as SiGe, SiC, GaAs, InAs, and/or InP. In some other example embodiments, the substrate 110 may have a silicon on insulator (SOI) structure. The substrate 110 may include a conductive region, for example, a well doped with impurities or a structure doped with impurities.

The deep trench region 110T between the first device region DR1 and the second device region DR2 is filled with an inter-device isolation layer 112A.

The plurality of fin-type active regions ACT extend parallel to each other in a direction (i.e., the X direction in FIG. 1). A device isolation layer 112B is formed between each of the plurality of fin-type active regions ACT on the first and second device regions DR1 and DR2. The device isolation layer 112B covers a lower portion of each of the plurality of fin-type active regions ACT on the first and second device regions DR1 and DR2. The plurality of fin-type active regions ACT may protrude to have a fin shape over the device isolation layer 112B. The inter-device isolation layer 112A and the device isolation layer 112B may be integrally connected to each other.

A plurality of interface layers 116, a plurality of gate insulating layers 118, and a plurality of gate lines GL may extend, on the substrate 110, in a direction (the Y direction in FIG. 1) that intersects the plurality of fin-type active regions ACT. The plurality of gate insulating layers 118 and the plurality of gate lines GL may extend while covering an upper surface and both sidewalls of each of the plurality fin-type active regions ACT and an upper surface of the device isolation layer 112B. A plurality of metal-oxide-semiconductor (MOS) transistors may be formed along the plurality of gate lines GL. Each of the plurality of MOS transistors may be a MOS transistor having a three-dimensional (3D) structure, in which a channel is formed on the upper surface and sidewalls of each of the plurality fin-type active regions ACT.

Both sidewalls of each interface layer 116, both sidewalls of each gate insulating layer 118, and both sidewalls of each gate line GL may be covered with an insulating spacer 124.

Each of the plurality of interface layers 116 may be obtained by oxidizing an exposed surface of each fin-type active region ACT, which may prevent a defective interface between the fin-type active region ACT and the gate insulating layer 118. In some example embodiments, each of the plurality of interface layers 116 may include a low dielectric material layer having a dielectric constant of 9 or less, for example, a silicon oxide layer, a silicon oxynitride layer, and/or a combination thereof. In some other example embodiments, each of the plurality of interface layers 116 may be formed of silicate or a combination of silicate, silicon oxide, and/or silicon oxynitride.

Each of the plurality of gate insulating layers 118 may include a silicon oxide layer, a high dielectric layer, and/or a combination thereof. The high dielectric layer may be formed of a material having a dielectric constant that is higher than that of the silicon oxide layer. For example, the gate insulating layer 118 may have a dielectric constant of about 10 to about 25. The high dielectric layer may be formed of a material selected from hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and/or a combination thereof. However, the inventive concept is not limited thereto. The plurality of gate insulating layers 118 may be formed by an atomic layer deposition (ALD) process, a chemical vapor deposition (CVD) process, and/or a physical vapor deposition (PVD) process.

The plurality of gate lines GL extend on the plurality of gate insulating layers 118 in a direction, which intersects the plurality of fin-type active regions ACT, while covering an upper surface and both sides of each of the plurality of fin-type active regions ACT.

The IC device 100 includes a gate recess region GR that is spaced apart from the first device region DR1 and the second device region DR2. The gate recess region GR may be disposed between the first device region DR1 and the second device region DR2, as illustrated in FIG. 1A. However, the inventive concept is not limited thereto. The gate recess region GR may be disposed in a region other than a device region of the IC device 100, for example, the first device region DR1 and the second device region DR2.

Each of the plurality of gate lines GL includes at least one first gate portion GL1 and at least one second gate portion GL2 which have upper surfaces positioned at different heights. The at least one first gate portion GL1 may be disposed on the device region of the IC device 100, for example, the first device region DR1 and the second device region DR2, and the at least one second gate portion GL2 may be disposed in the gate recess region GR.

The at least one first gate portion GL1 extends in a direction (i.e., Y direction) to cover the plurality of fin-type active regions ACT on the first and second regions DR1 and DR2, and may have a flat upper surface at a first level LV1. The at least one second gate portion GL2 is integrally connected to the at least one first gate portion GL1. The at least one second gate portion GL2 may extend in a direction (i.e., Y direction) to cover the inter-device isolation layer 112A in the deep trench region 110T, in the gate recess region GR. The at least one second gate portion GL2 may have an upper surface at a second level LV2 that is closer to the substrate 110 than the first level LV1. For example, the second level LV2 may be lower than the first level LV1.

The lowest surface of each of the first and second gate portions GL1 and GL2 may be positioned at a predetermined level L0 on the same plane extending along an X-Y plane on the substrate 110. In some embodiments, the lowest surfaces the first and second gate portions GL1 and GL2 may not be coplanar with each other. For example, the lowest surface of the second gate portion GL2 may be positioned at a lower level than that of the first gate portion GL1.

The at least one first gate portion GL1 has a bottom facing the device isolation layer 112B. The at least one first gate portion GL1 may have a first thickness TH1 in the Z direction on the device isolation layer 112B. The at least one second gate portion GL2 has a bottom facing the inter-device isolation layer 112A. The at least one second gate portion GL2 may have a second thickness TH2, which is smaller than the first thickness TH1, on the inter-device isolation layer 112A filling the deep trench region 110T.

In some example embodiments, each of the plurality of gate lines GL may have a structure in which a metal nitride layer, a metal layer, a conductive capping layer, and a gap-fill metal layer are sequentially stacked.

The metal nitride layer and the metal layer each may include at least one selected from Ti, Ta, W, Ru, Nb, Mo, and Hf.

The metal nitride layer and the metal layer each may be formed by an ALD process, a metal organic ALD (MOALD) process, and/or a metal organic CVD (MOCVD) process.

The conductive capping layer may function as a protective layer for preventing a surface of the metal layer from being oxidized. Also, the conductive capping layer may function as a wetting layer for facilitating deposition when another conductive layer is deposited on the metal layer. The conductive capping layer may be formed of a metal nitride, e.g., TiN, TaN, and/or a combination thereof, but is not limited thereto.

The gap-fill metal layer may extend on the conductive capping layer in a direction (i.e., Y direction) while filling a space between each of the plurality of fin-type active regions ACT. The gap-fill metal layer may include a tungsten (W) layer, or aluminum (Al). The gap-fill metal layer may be formed by an ALD process, a CVD process, and/or a PVD process. The gap-fill metal layer may bury, without forming a void, a recess space that is formed by a step portion of an upper surface of the conductive capping layer in the space between each of the plurality of fin-type active regions ACT.

An insulating capping layer 140 covering upper surfaces of the plurality of gate lines GL is formed on the plurality of gate lines GL. The insulating capping layer 140 may extend discontinuously to cover the first gate portion GL1 of each gate line GL and not to cover the second gate portion GL2 of each gate line GL.

Both sidewalls of each of the plurality of gate lines GL and both sidewalls of the insulating capping layer 140 may each be covered with an insulating spacer 124. The insulating spacer 124 may extend continuously on the first device region DR1, the second device region DR2, and the deep trench region 110T along both sidewalls of each of the plurality of gate lines GL.

The insulating spacer 124 may have a first height H1 (refer to FIG. 1C) on the first device region DR1 and the second device region DR2, and may have a second height H2 (refer to FIG. 1D), which is smaller than the first height H1, in the gate recess region GR on the deep trench region 110T.

In some example embodiments, the insulating spacer 124 may be formed of a material selected from silicon nitride (Si3N4), silicon oxynitride (SiON), carbon-containing silicon oxynitride (SiCON), and/or a combination thereof. In some example embodiments, the insulating spacer 124 may be formed of a material that is the same as that of the insulating capping layer 140. In some other example embodiments, the insulating spacer 124 may be formed of a material that is different from that of the insulating capping layer 140.

In some example embodiments, a process of reducing the height (or thickness) of the gate line GL may be performed to form the second gate portion GL2 in the gate recess region GR. In this case, the insulating capping layer 140 covering the gate line GL may be first removed before etching some of the thickness of the gate line GL in the gate recess region GR. In addition, while the insulating capping layer 140 is removed, a portion of the insulating spacer 124 having etching characteristics that are the same as or similar to those of the insulating capping layer 140 may be removed at the same time as the insulating capping layer 140 in the gate recess region GR, and thus, the height of the insulating spacer 124 may be lowered. Accordingly, the insulating spacer 124 having the relatively low second height H2 may be obtained in the gate recess region GR, as illustrated in FIG. 1A.

In the first device region DR1, an upper surface of the first gate portion GL1 and an upper surface of the gate insulating layer 118 may be positioned at the same level, e.g., the first level LV1.

In the second device region DR2, an upper surface of the second gate portion GL2 and the upper surface of the gate insulating layer 118 may be positioned at different levels. In some example embodiments, as illustrated in FIG. 1D, the upper surface of the second gate portion GL2 may be positioned at a level that is lower than that of the gate insulating layer 118.

A plurality of first contact plugs PA and a plurality of second contact plugs PB may be formed on the plurality of fin-type active regions ACT. The plurality of first contact plugs PA may be connected to a plurality of source/drain regions 120 formed in the plurality of fin-type active regions ACT. The plurality of second contact plugs PB may be connected to the plurality of gate lines GL.

The plurality of source/drain regions 120 may each include a first source/drain region 120A formed in a portion of each of the plurality of fin-type active regions ACT, which is at both sides of the gate line GL, and a second source/drain region 120B formed in a semiconductor layer ES that is disposed on the first source/drain region 120A and epitaxially grown from the plurality of fin-type active regions ACT. In some embodiments, the first source/drain region 120A may include an epitaxial layer.

The plurality of first contact plugs PA and the plurality of second contact plugs PB may be insulated from one another by an inter-gate insulating layer 132, which fills a space between each of the plurality of gate lines GL, and an interlayer insulating layer 134 that covers the plurality of fin-type active regions ACT and the plurality of gate lines GL. Each first contact plug PA may penetrate the interlayer insulating layer 134 and the inter-gate insulating layer 132, and thus may be connected to the source/drain region 120.

The inter-gate insulating layer 132 may be formed to cover an upper surface of the source/drain region 120 and both sidewalls of each of the plurality of gate line GL. The inter-gate insulating layer 132 and the interlayer insulating layer 134 may be formed of silicon oxide, but is not limited thereto.

The insulating capping layer 140 may prevent an undesirable foreign substance, such as oxygen, from permeating into each gate line GL, and thus may prevent a phenomenon, in which a threshold voltage undesirably changes in the gate line GL, or a short circuit phenomenon that may occur between the gate line GL and the first contact plug PA. In addition, by forming the insulating capping layer 140, a constant threshold voltage may be maintained in the gate line GL, and the electrical characteristics deterioration of a transistor including the gate line GL may be prevented. In FIGS. 1B and 1B, both sidewalls of the insulating capping layer 140 are covered with the insulating spacer 124. However, the inventive concept is not limited thereto. For example, the insulating capping layer 140 may be formed on the insulating spacer 124 to cover the gate line GL and the insulating spacer 124.

In some example embodiments, the insulating capping layer 140 may have a thickness of about 20 Å to about 50 Å. In some example embodiments, the insulating capping layer 140 may be a layer including silicon and nitrogen. For example, the insulating capping layer 140 may be formed of Si3N4, SiON, SiCON, or a combination thereof.

The inter-gate insulating layer 132 and the interlayer insulating layer 134 may include a silicon oxide layer, but is not limited thereto. In some example embodiments, at least one selected from the inter-gate insulating layer 132 and the interlayer insulating layer 134 may include tetra ethyl ortho silicate (TEOS) layer. In some example embodiments, at least one selected from the inter-gate insulating layer 132 and the interlayer insulating layer 134 may include any one of ultra low K (ULK) layers having an ultra low dielectric constant K of about 2.2 to about 2.4, for example, an SiOC layer and an SiCOH layer.

In the IC device 100 illustrated in FIGS. 1A through 1D, a power supply line VDD may be connected to a fin-type active region ACT in the first device region DR1, and a ground line VSS may be connected to a fin-type active region ACT in the second device region DR2.

The power supply line VDD and the ground line VSS may each be formed at the same level as a wiring layer that is formed on the interlayer insulating layer 134. However, the inventive concept is not limited thereto.

The first and second contact plugs PA and PB, the power supply line VDD, and the ground line VSS may each have a stack structure in which a barrier layer and a conductive layer for wiring are stacked. The barrier layer may be formed of TiN, TaN, and/or a combination thereof. The conductive layer for wiring may be formed of W, Cu, an alloy of W and Cu, or a combination thereof. A CVD process, an ALD process, and/or an electroplating process may be used to form the first and second contact plugs PA and PB, the power supply line VDD, and the ground line VSS.

In the IC device 100 illustrated in FIGS. 1A through 1D, each of the plurality of gate lines GL has a vertical sidewall VW extending from an upper surface of the first gate portion GL1, positioned at the first level LV1, to an upper surface of the second gate portion GL2, positioned at the second level LV2, between the first gate portion GL1 and the second gate portion GL2. However, the inventive concept is not limited thereto. For example, a slanted or rounded sidewall extending from the upper surface of the first gate portion GL1, positioned at the first level LV1, to the upper surface of the second gate portion GL2, positioned at the second level LV2, may be formed.

Figure 1E:
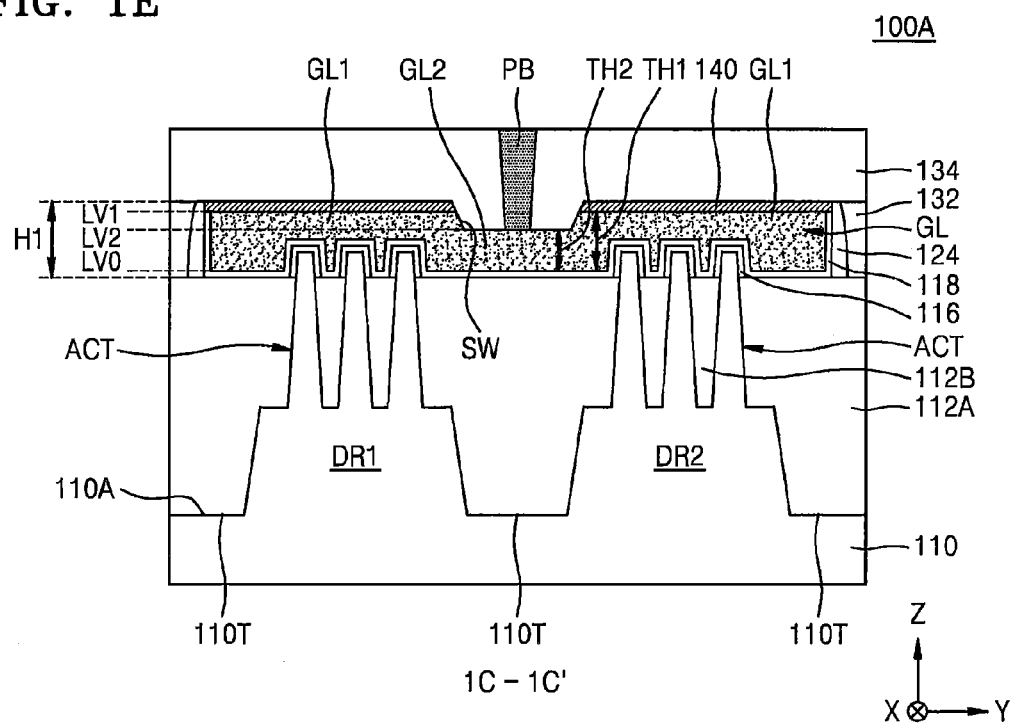
FIG. 1E is a cross-sectional view of an IC device according to other example embodiments.

FIG. 1E is a cross-sectional view of an IC device 100A according to another example embodiment, and illustrates a structure in which a slanted sidewall SW is formed between a first gate portion GL1 and a second gate portion GL2.

The IC device 100A illustrated in FIG. 1E may have a layout that is the same as the layout of FIG. 1A, and may correspond to the cross-sectional structure taken along the line 1C-1C' of FIG. 1A. In FIG. 1E, reference numerals that are the same as those of FIGS. 1A through 1D denote the same elements, and thus, their detailed description will be omitted.

A plurality of gate lines GL of the IC device 100A further include the slanted sidewall SW that extends between the first gate portion GL1 and the second gate portion GL2. The slanted sidewall SW extends from an upper surface of the first gate portion GL1 positioned at a first level LV1 to an upper surface of the second gate portion GL2 positioned at a second level LV2.

Figure 1F:
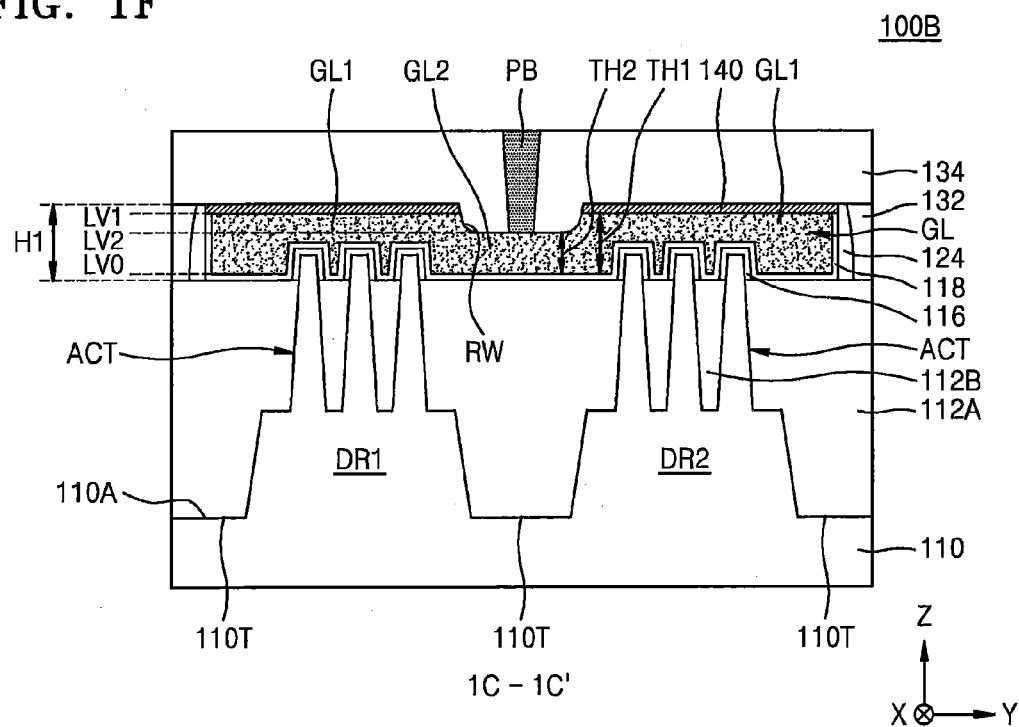
FIG. 1F is a cross-sectional view of an IC device according to other example embodiments.

FIG. 1F is a cross-sectional view of an IC device 100B according to another example embodiment, and illustrates a structure in which a rounded sidewall RW is formed between a first gate portion GL1 and a second gate portion GL2.

The IC device 100B illustrated in FIG. 1F may have a layout that is the same as the layout of FIG. 1A, and may correspond to the cross-sectional structure taken along the line 1C-1C' of FIG. 1A. In FIG. 1F, reference numerals that are the same as those of FIGS. 1A through 1D denote the same elements, and thus, their detailed description will be omitted.

A plurality of gate lines GL of the IC device 100B further include the rounded sidewall RW that extends between the first gate portion GL1 and the second gate portion GL2. The rounded sidewall RW extends from an upper surface of the first gate portion GL1 positioned at a first level LV1 to an upper surface of the second gate portion GL2 positioned at a second level LV2.

Each of the IC devices 100, 100A, and 100B described with reference to FIGS. 1A through 1F includes the gate line GL having at least one first gate line GL1 and at least one second gate line GL2, which have upper surfaces positioned at different heights. The second gate portion GL2 extends to cover the inter-device isolation layer 112A filling the deep trench region 110T that is separated from the first device region DR1 and the second device region DR2. The second gate portion GL2 has an upper surface having a level that is lower than that of an upper surface of the first gate portion GL1, and in the gate recess region GR, the thickness of the second gate portion GL2 on the inter-device isolation layer 112A is smaller than that of the first gate portion GL1 on the device isolation layer 112B. Accordingly, parasitic capacitance, which occurs due to coupling between the second gate portion GL2 extending on the deep trench region 110T and another node, for example, the source/drain region 120 positioned around the second gate region GL2, the first and second contact plugs PA and PB, or wiring structures formed on the first and second contact plugs PA and PB, may be reduced. Thus, "ON" current characteristics and "OFF" current characteristics of a FinFET may be improved, and thus the deterioration of the performance of the FinFET may be prevented. In addition, the operation speed of the FinFET may be improved, and the power consumption thereof may be reduced.

Figure 2:
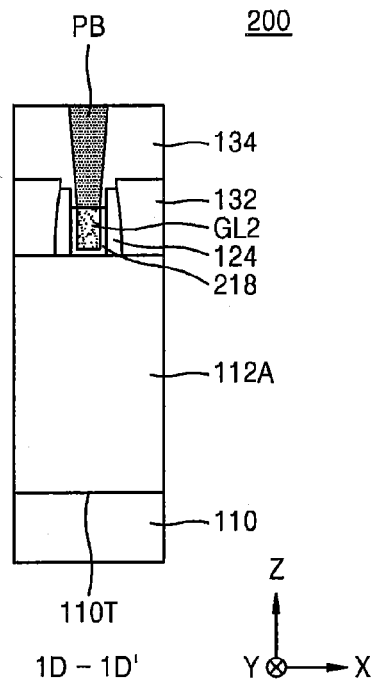
FIG. 2 is a cross-sectional view of an IC device according to other example embodiments.

FIG. 2 is a cross-sectional view of an IC device 200 according to another example embodiment. The IC device 200 illustrated in FIG. 2 may have the same layout as the IC device 100 illustrated in FIG. 1A. FIG. 2 illustrates a structure corresponding to a cross section taken along the line 1D-1D' of FIG. 1A.

The IC device 200 illustrated in FIG. 2 has a structure that is substantially similar to that of the IC device 100 illustrated in FIGS. 1A through 1D. However, the IC device 200 includes a gate insulating layer 218 having a height that is smaller than that of an upper surface of an insulating space 124 in a gate recess region GR, instead of the gate insulating layer 118 illustrated in FIGS. 1B through 1D.

In some example embodiments, the height of the gate insulating layer 218 in the gate recess region GR may be the same as that of a second gate portion GL2. In some example embodiments, a second contact plug PB in the gate recess region GR may have a sidewall facing an insulating spacer 124. In some example embodiments, a space between the insulating spacer 124 and the second contact plug PB may be filled with an interlayer insulating layer 134. In some other example embodiments, the insulating spacer 124 may contact a sidewall of the second contact plug PB.

In order that an upper surface of the gate insulating layer 218 and an upper surface of the second gate portion GL2 are positioned at substantially the same level, as illustrated in FIG. 2, a portion of the gate insulating layer 218 also may be removed while reducing the height of the gate line GL by removing a portion of the gate line GL to form the second gate line GL2 in the gate recess region GR. A process of removing the portion of the gate line GL and a process of removing the portion of the gate insulating layer 218 may be sequentially or simultaneously performed.

Figure 3:
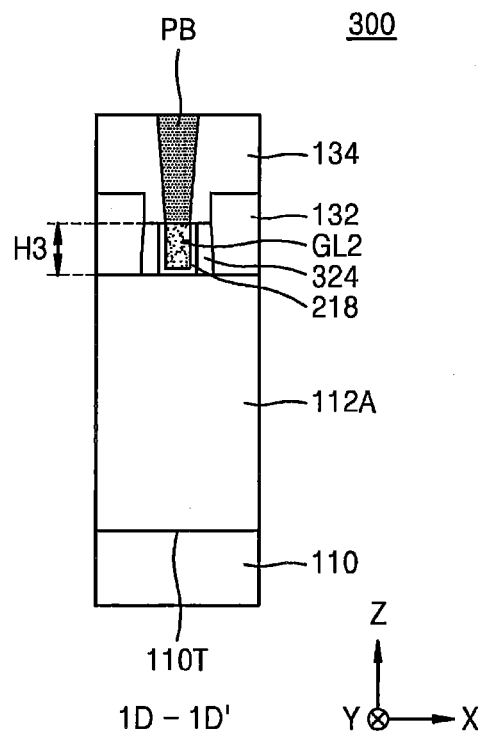
FIG. 3 is a cross-sectional view of an IC device according to other example embodiments.

FIG. 3 is a cross-sectional view of an IC device 300 according to another example embodiment. The IC device 300 illustrated in FIG. 3 may have the same layout as the IC device 100 illustrated in FIG. 1A. FIG. 3 illustrates a structure corresponding to a cross section taken along the line 1D-1D' of FIG. 1A.

The IC device 300 illustrated in FIG. 3 has a structure that is substantially similar to that of the IC device 200 illustrated in FIG. 2. However, the IC device 300 includes an insulating spacer 324 having an upper surface whose height in the gate recess region GR is lower than that of the upper surface of the insulating spacer 124 illustrated in FIGS. 1B through 2.

The insulating spacer 324 may have a first height H1 (refer to FIG. 1C), similar to the insulating spacer 124 illustrated in FIGS. 1B through 2, on the first device region DR1 and the second device region DR2, and may have a third height H3 (refer to FIG. 3), which is smaller than the first height H1, in the gate recess region GR on the deep trench region 110T.

Figure 4A:
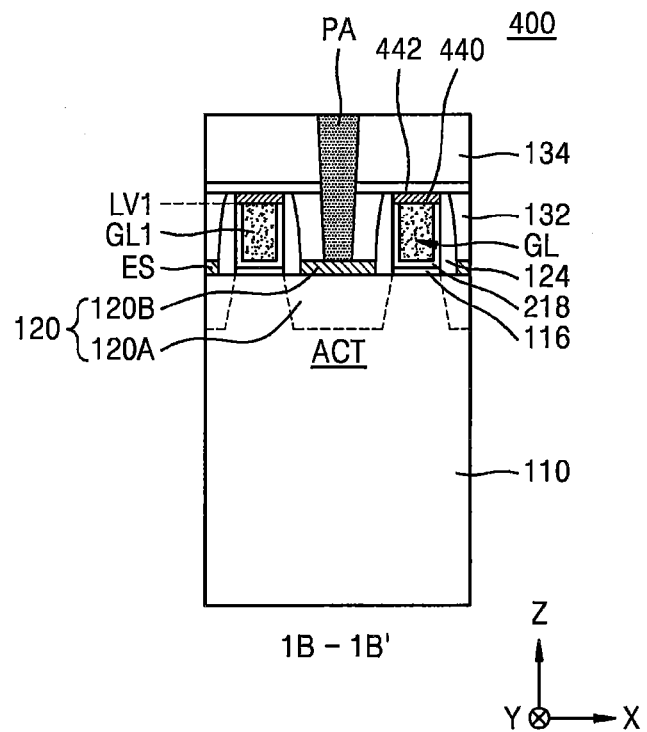
FIGS. 4A through 4C are cross-sectional views of an IC device according to other example embodiments.
Figure 4B:
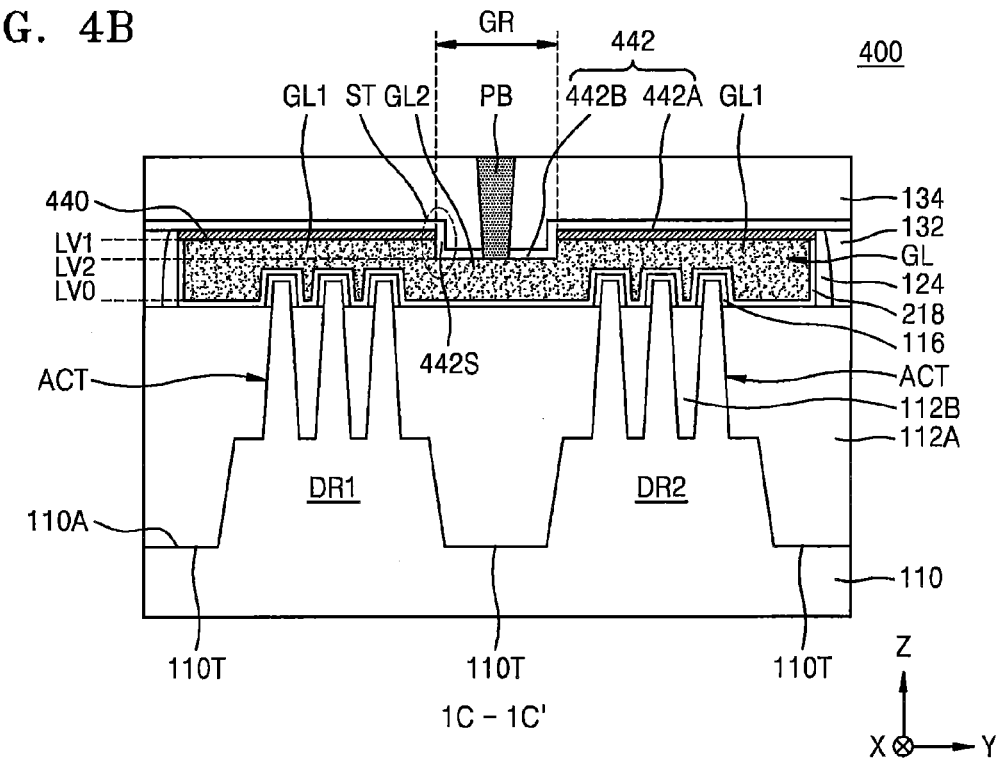
Figure 4C:
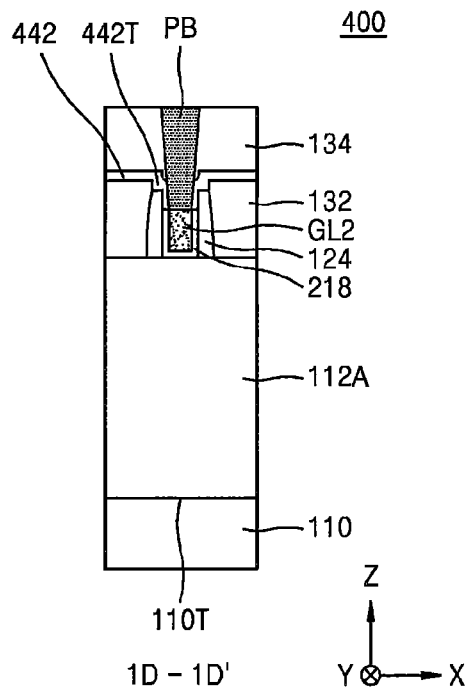

In the gate recess region GR on the deep trench region 110T, an upper surface of the insulating spacer 324, an upper surface of a gate insulating layer 218, and an upper surface of a second gate portion GL2 may be positioned at substantially the same level. FIGS. 4A through 4C are cross-sectional views of an IC device 400 according to another example embodiment.

The IC device 400 illustrated in FIGS. 4A through 4C may have the same layout as the IC device 100 illustrated in FIG. 1A. FIG. 4A illustrates a structure corresponding to a cross section taken along line 1B-1B' of FIG. 1A, FIG. 4B illustrates a structure corresponding to a cross section taken along line 1C-1C' of FIG. 1A, and FIG. 4C illustrates a structure corresponding to a cross section taken along line 1D-1D' of FIG. 1A.

The IC device 400 illustrated in FIGS. 4A through 4C has a structure that is substantially similar to that of the IC device 200 illustrated in FIG. 2. However, the IC device 400 includes a first insulating capping layer 440 covering an upper surface of a gate line GL and a second insulating capping layer 442 covering the first insulating capping layer 440.

The first insulating capping layer 440 may have the same structure as the insulating capping layer 140 described with reference to FIGS. 1A through 1D. The insulating capping layer 440 may extend discontinuously to cover a first gate portion GL1 of the gate line GL and not to cover a second gate portion GL2 of the gate line GL, and may have a sidewall that is covered by an insulating spacer 124.

The second insulating capping layer 442 may include a first portion 442A that is spaced apart from the first gate portion GL1 with the first insulating capping layer 440 therebetween on a first device region DR1 and a second device region DR2, and a second portion 442B that is integrally connected to the first portion 442A and contacts the second gate portion GL2 in a gate recess region GR on a deep trench region 110T. The second insulating capping layer 442 may continuously extend in a region on the gate line GL, except for a portion in which a second contact plug PB has been formed.

As illustrated in a region ST indicated by a dotted line in FIG. 4B, the second insulating capping layer 442 may have a step portion 442S around the boundary of the gate recess region GR on the deep trench region 110T. As illustrated in FIG. 4C, the second insulating capping layer 442 may have a step portion 442T between the second gate portion GL2 and the inter-gate insulating layer 132. In addition, as illustrated in FIG. 4C, in the gate recess region GR on the deep trench region 110T, the second insulating capping layer 442 may surround the second contact plug PB.

In some example embodiments, the first insulating capping layer 440 and the second insulating capping layer 442 may be formed of the same material. In some other example embodiments, the first insulating capping layer 440 and the second insulating capping layer 442 may be formed of different materials. For example, the first insulating capping layer 440 and the second insulating capping layer 442 each may be formed of any one selected from $Si_3N_4$, SiON, SiCON, and/or a combination thereof.

Figure 5A:
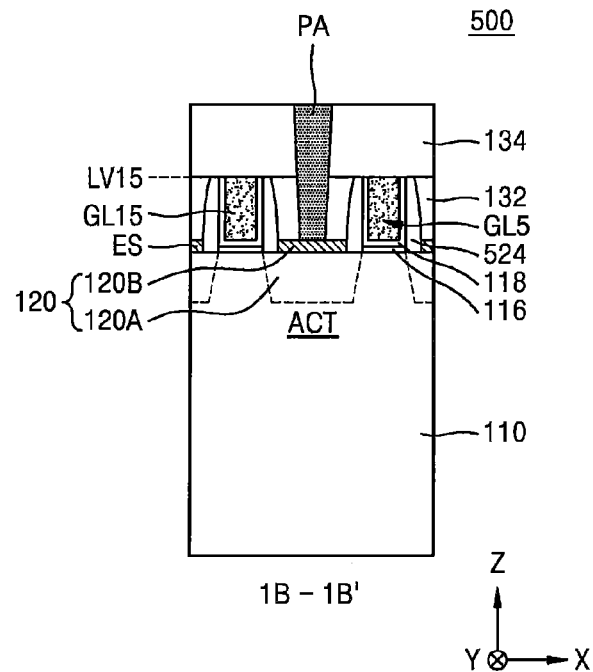
FIGS. 5A through 5C are cross-sectional views of an IC device according to other example embodiments.
Figure 5B:
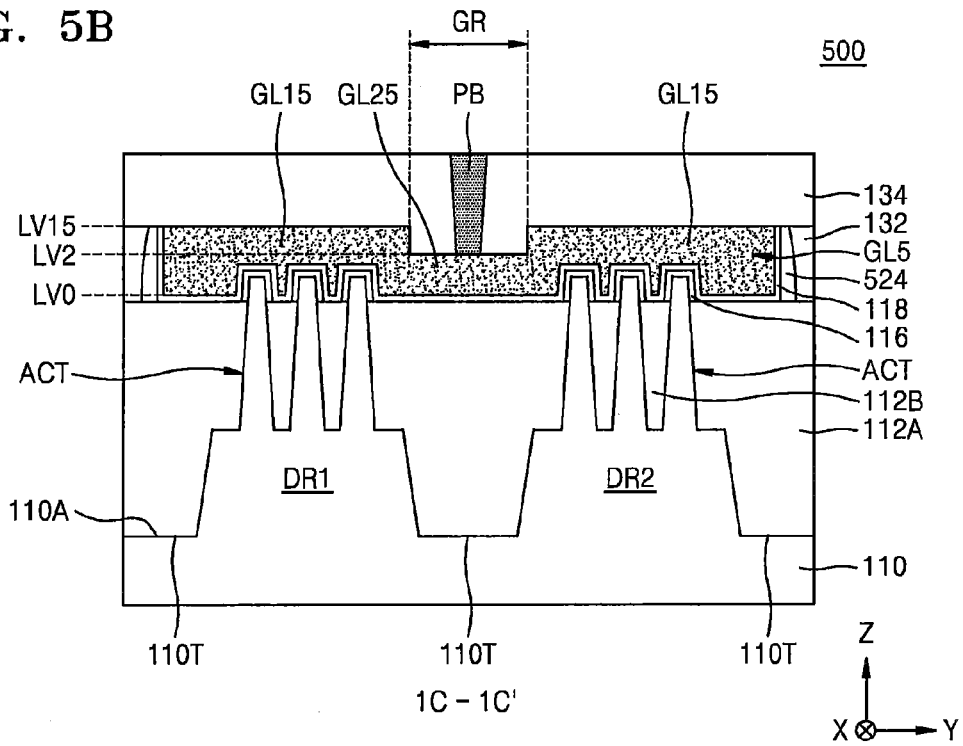
Figure 5C:
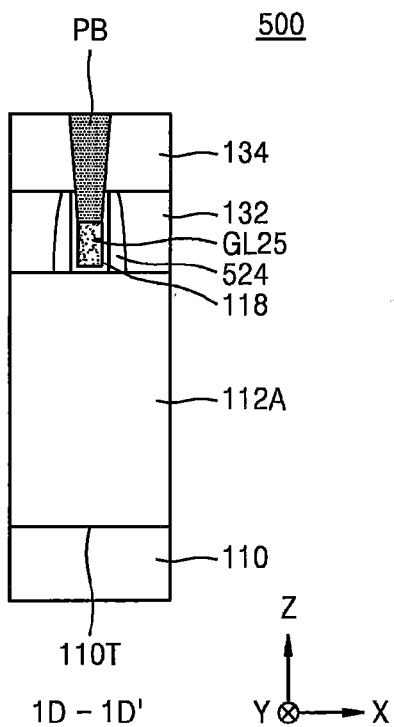

FIGS. 5A through 5C are cross-sectional views of an IC device 500 according to another example embodiment.

The IC device 500 illustrated in FIGS. 5A through 5C may have the same layout as the IC device 100 illustrated in FIG. 1A. FIG. 5A illustrates a structure corresponding to a cross section taken along line 1B-1B' of FIG. 1A, FIG. 5B illustrates a structure corresponding to a cross section taken along line 1C-1C' of FIG. 1A, and FIG. 5C illustrates a structure corresponding to a cross section taken along line 1D-1D' of FIG. 1A.

The IC device 500 illustrated in FIGS. 5A through 5C has a structure that is substantially similar to that of the IC device 100 illustrated in FIGS. 1A through 1D. However, the IC device 500 does not include the insulating capping layer 140 illustrated in FIGS. 1B and 1C. The IC device 500 includes an insulating spacer 524 having substantially the same height on a first device region DR1, a second device region DR2, and a deep trench region 110T, instead of the insulating spacer 124 illustrated in FIGS. 1B through 1D. As illustrated in FIG. 5C, in the gate recess region GR on the deep trench region 110T, an upper surface of the insulating spacer 524 may be positioned at substantially the same level as an upper surface of an inter-gate insulating layer 132. The insulating spacer 524 may be formed of any one selected from $Si_3N_4$, SiON, SiCON, and/or a combination thereof.

In addition, in the first and second device regions DR1 and DR2 of the IC device 500, a plurality of gate lines GL5 includes a first gate portion GL15 having an upper surface positioned at the same level LV15 as an upper surface of the insulating spacer 524, and a second gate portion GL25 having an upper surface positioned at a lower level than that of an upper surface of the first gate portion GL15. More details of the gate lines GL5 refer to those described with respect to the gate line GL with reference to FIGS. 1A through 1D.

Figure 6A:
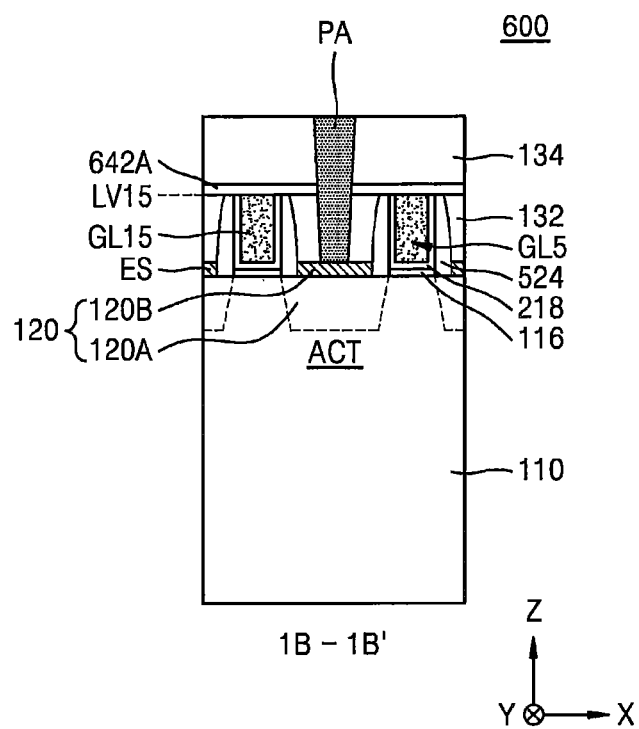
FIGS. 6A through 6C are cross-sectional views of an IC device according to other example embodiments.
Figure 6B:
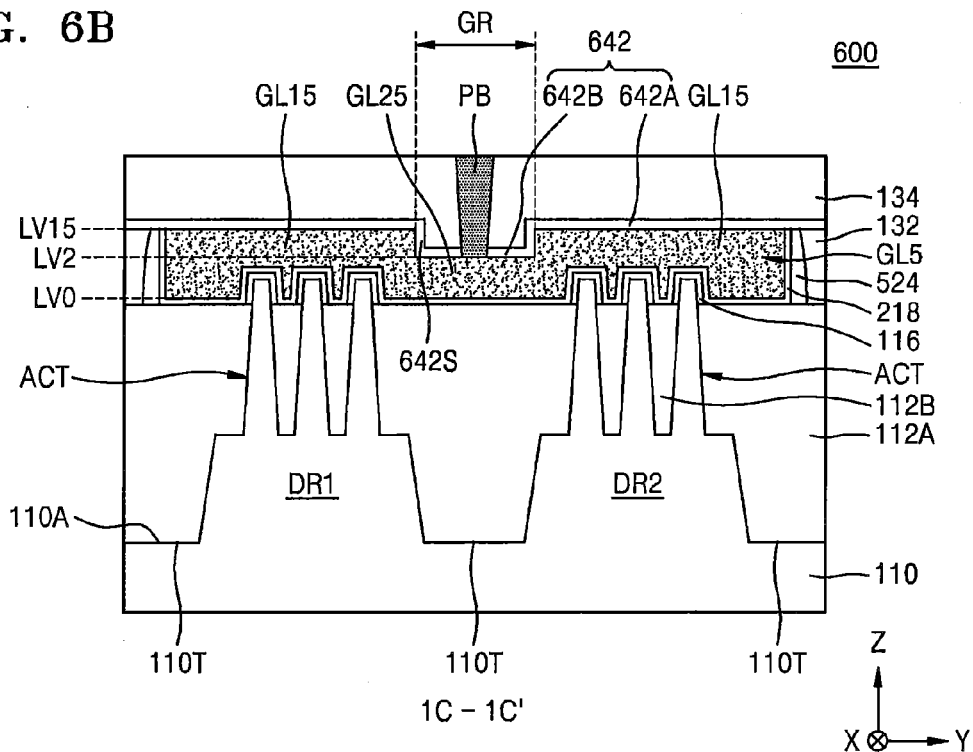
Figure 6C:
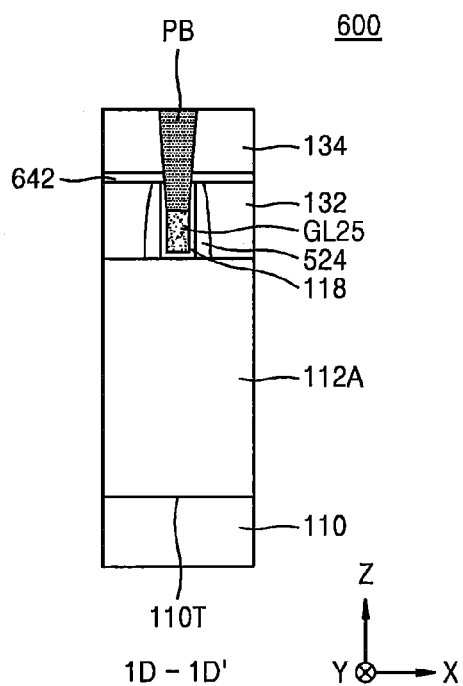

FIGS. 6A through 6C are cross-sectional views of an IC device 600 according to another example embodiment.

The IC device 600 illustrated in FIGS. 6A through 6C may have the same layout as the IC device 100 illustrated in FIG. 1A. FIG. 6A illustrates a structure corresponding to a cross section taken along line 1B-1B' of FIG. 1A, FIG. 6B illustrates a structure corresponding to a cross section taken along line 1C-1C' of FIG. 1A, and FIG. 6C illustrates a structure corresponding to a cross section taken along line 1D-1D' of FIG. 1A.

The IC device 600 illustrated in FIGS. 6A through 6C has a structure that is substantially similar to that of the IC device 500 illustrated in FIGS. 5A through 5C. However, the IC device 600 includes an insulating capping layer 642 covering an upper surface of a gate line GL5.

The insulating capping layer 642 may have the same structure as the insulating capping layer 440 described with reference to FIGS. 4A through 4C. However, the insulating capping layer 642 may include a first portion 642A that contacts a first gate portion GL15 on a first device region DR1 and a second device region DR2, and a second portion 642B that is connected to the first portion 642A in one body and contacts a second gate portion GL2 in a gate recess region GR on a deep trench region 110T. The insulating capping layer 642 may continuously extend in a region on the gate line GL5, except for a portion in which a second contact plug PB has been formed.

As illustrated in FIG. 6B, the insulating capping layer 642 may have a step portion 642S around the boundary of the gate recess region GR on the deep trench region 110T. In addition, as illustrated in FIG. 6C, in the gate recess region GR on the deep trench region 110T, the insulating capping layer 642 may surround the second contact plug PB.

The insulating capping layer 640 may be formed of any one selected from Si3N4, SiON, SiCON, and a combination thereof.

Figure 7A:
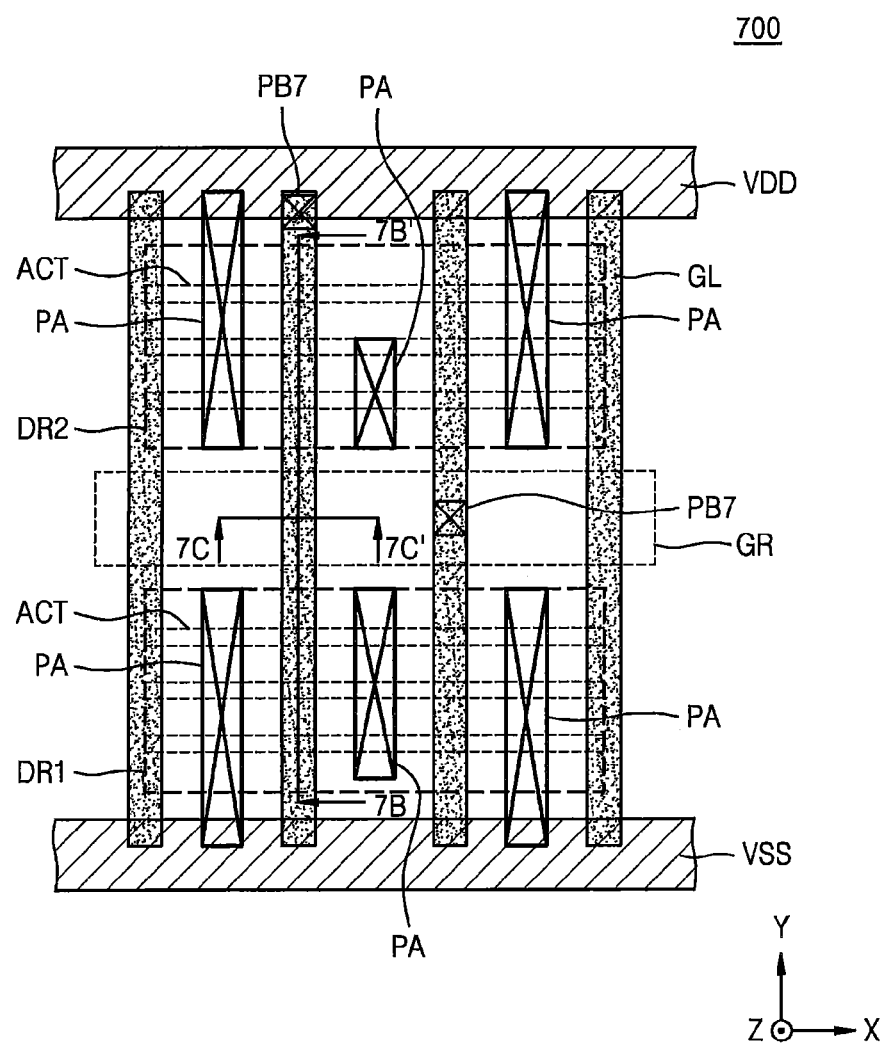
FIG. 7A is a layout diagram of an IC device according to other example embodiments.
Figure 7B:
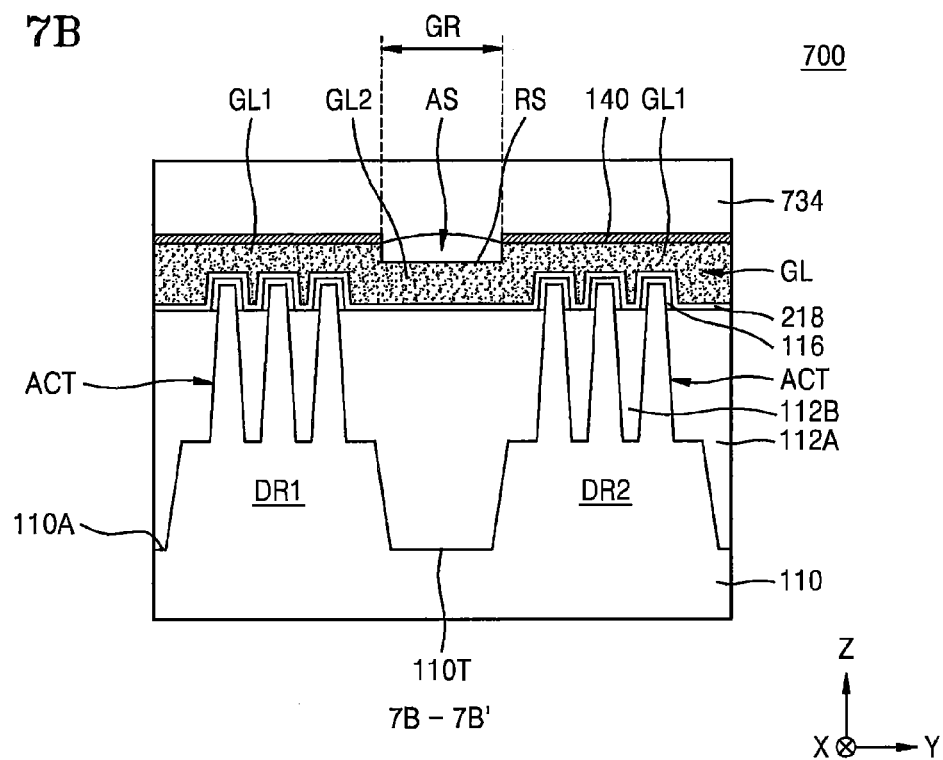
FIG. 7B is a cross-sectional view taken along line 7B-7B' of FIG. 7A.
Figure 7C:
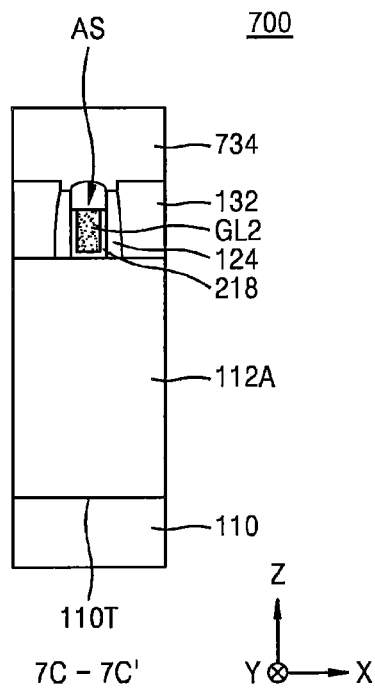
FIG. 7C is a cross-sectional view taken along line 7C-7C' of FIG. 7A.

FIGS. 7A through 7C are diagrams illustrating structures of essential parts of an IC device 700 according to another example embodiment. More specifically, FIG. 7A is a layout diagram of the IC device 700. FIG. 7B is a cross-sectional view taken along line 7B-7B' of FIG. 7A, and FIG. 7C is a cross-sectional view taken along line 7C-7C' of FIG. 7A.

The IC device 700 illustrated in FIGS. 7A through 7C has a similar structure to the IC device 200 illustrated in FIG. 2. However, in the IC device 700, the position of a second contact plug PB7 corresponding to the second contact plug PB illustrated in FIG. 1A is different from that of the second contact plug PB illustrated in FIG. 1A, and in a gate recess region GR on a deep trench region 110T, an air space region AS is formed between a second gate portion GL2 of a gate line GL and an interlayer insulating layer 134.

In some example embodiments, in order to manufacture the IC device 700 including the air space region AS, a structure, in which both sidewalls of each of a plurality of gate lines GL are sequentially covered with a gate insulating layer 218, an insulating spacer 124, and an inter-gate insulating layer 132, may be formed, a second gate line GL2, which has a recess surface RS that is obtained by lowering an upper surface by removing a portion of each of the plurality of gate lines GL in the gate recess region GR, may be formed, and then, in a state in which the recess surface RS is exposed, an interlayer insulating layer 734 may be formed on the plurality of gate lines GL, the gate insulating layer 218, the insulating spacer 124, and the inter-gate insulating layer 132. When performing a deposition process for the formation of the interlayer insulating layer 734, deposition process conditions may be controlled so that the air space region AS remains without completely filling a space on the recess surface RS. In some example embodiments, in order that after the interlayer insulating layer 734 is formed, the air space region AS remains between the recess surface RS of each of the plurality of gate lines GL and the interlayer insulating layer 734, a process condition having a relatively degraded step coverage may be adopted during a deposition process for the interlayer insulating layer 734. The interlayer insulating layer 734 may include an oxide layer, a nitride layer, or a combination thereof. For example, the interlayer insulating layer 734 may include a high density plasma (HDP) oxide layer.

According to the IC device 700 illustrated in FIGS. 7A through 7C, relative permittivity between each of the plurality of gate lines GL and each of conductive lines adjacent to the plurality of gate lines GL may be reduced since on the deep trench region 110T the air space region AG is formed between the second gate portion GL2 of the gate line GL and the interlayer insulating layer 134, and thus, capacitance between adjacent conductive lines may be reduced.

Figure 8A:
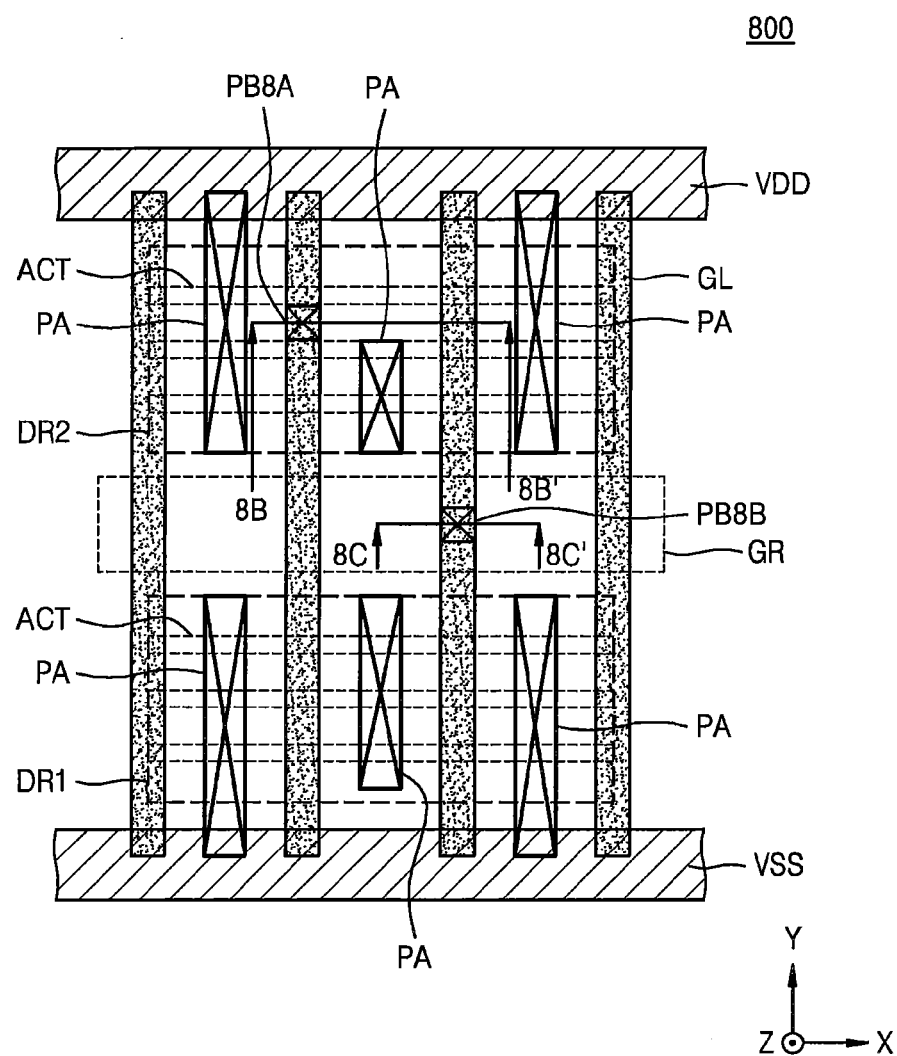
FIG. 8A is a layout diagram of an IC device according to other example embodiments.
Figure 8B:
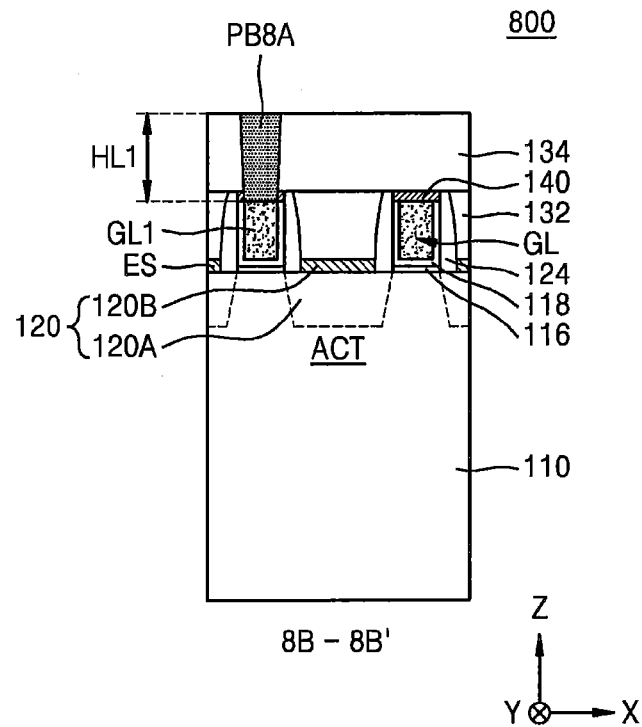
FIG. 8B is a cross-sectional view taken along line 8B-8B' of FIG. 8A.
Figure 8C:
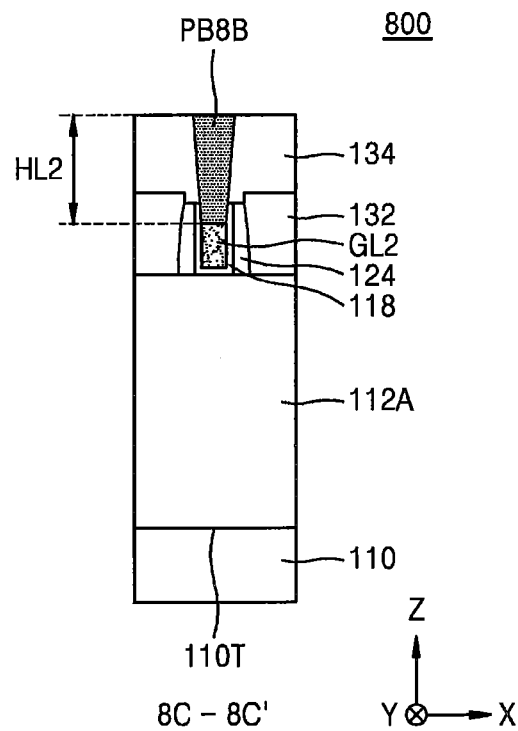
FIG. 8C is a cross-sectional view taken along line 8C-8C' of FIG. 8A.

FIGS. 8A through 8C are diagrams illustrating structures of essential parts of an IC device 800 according to another example embodiment. More specifically, FIG. 8A is a layout diagram of the IC device 800. FIG. 8B is a cross-sectional view taken along line 8B-8B' of FIG. 8A, and FIG. 8C is a cross-sectional view taken along line 8C-8C' of FIG. 8A.

The IC device 800 illustrated in FIGS. 8A through 8C has a similar structure to the IC device 100 illustrated in FIG. 1. However, the positions of a plurality of second contact plugs PB8A and PB8B corresponding to the second contact plug PB illustrated in FIG. 1A may be different from that of the second contact plug PB illustrated in FIG. 1A, and vertical direction lengths HL1 and HL2 of the second plugs PB8A and PB8B may be changed according to positions where the second contact plugs PB8A and PB8B are formed.

More specifically, in the IC device 800, the plurality of second contact plugs PB8A and PB8B includes the second contact plug PB8A, which is connected to a first gate portion GL1 of a gate line GL, on a second device region DR2, and the second contact plug PB8B, which is connected to a second gate portion GL1 of the gate line GL, in a gate recess region GR. The vertical direction length HL2 of the second contact plug PB8B that is connected to the second gate portion GL2 in the gate recess region GR is greater than the vertical direction length HL1 of the second contact plug PB8A that is connected to the first gate portion GL1 on the second device region DR2.

FIG. 9 is a cross-sectional view of an IC device 900 according to another example embodiment. The IC device 900 illustrated in FIG. 9 may have substantially the same layout as the IC device 100 illustrated in FIG. 1A. However, in the IC device 900, the position of a second contact plug PB9 corresponding to the second contact plug PB illustrated in FIG. 1A is different from that of the second contact plug PB illustrated in FIG. 1A. FIG. 9 illustrates a structure corresponding to a cross section taken along the line 1C-1C' of FIG. 1A.

The IC device 900 illustrated in FIG. 9 includes that second contact plug PB9 that is positioned on a gate line GL and connected to the gate line GL. The second contact plug PB9 may perform a function corresponding to the function of the second contact plug PB illustrated in FIG. 1A. The second contact plug PB9 has a sidewall S9 contacting a first gate portion GL1 and a bottom B9 contacting a second gate portion GL2. The gate line GL may be connected to the second contact plug PB9 around the boundary of a gate recess region GR (refer to FIG. 1A).

According to the IC device 900 illustrated in FIG. 9, a contact area between the contact plug PB9 and the gate line GL may be larger than that in the IC device 100 illustrated in FIG. 1A since there is a contact side that is connected to the gate line GL at the sidewall S9 and bottom B9 of the second contact plug PB9. Accordingly, contact resistance between the gate line GL and the second contact plug PB9 may be reduced.

Figure 10A:
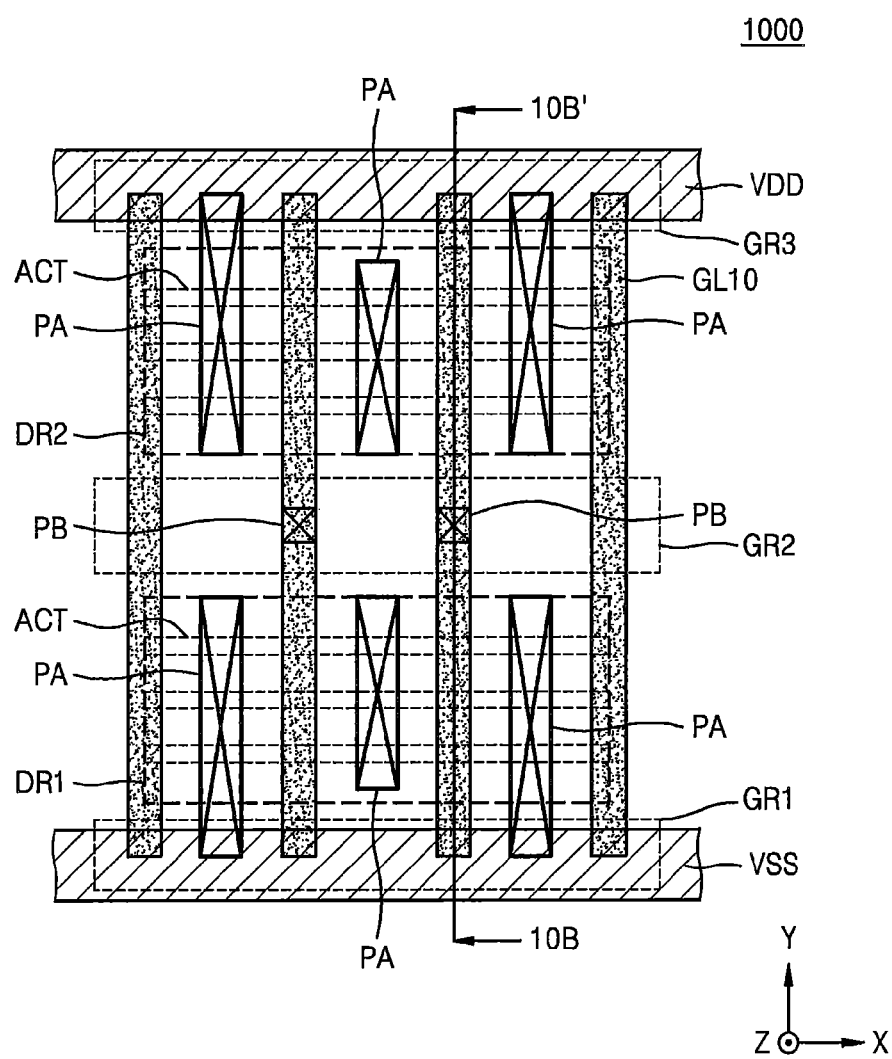
FIG. 10A is a layout diagram of an IC device according to other example embodiments.
Figure 10B:
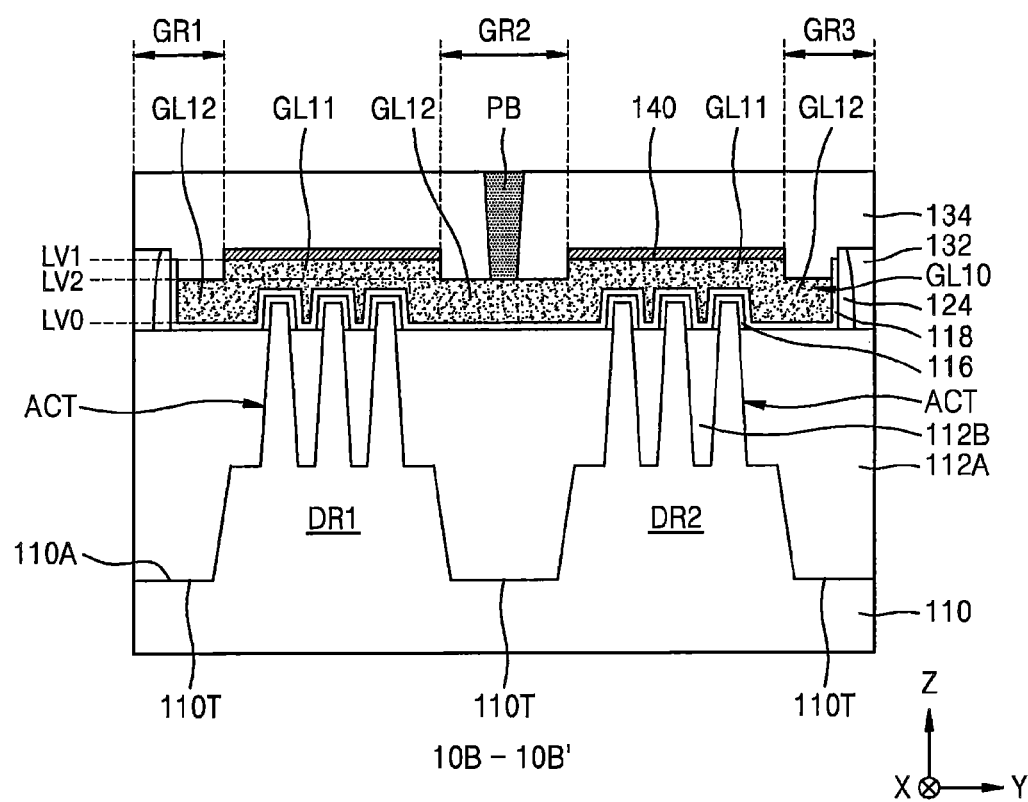
FIG. 10B is a cross-sectional view taken along a line 10B-10B' of FIG. 10A.

FIGS. 10A and 10B are diagrams illustrating structures of essential parts of an IC device 1000 according to another example embodiment. More specifically, FIG. 10A is a layout diagram of the IC device 1000. FIG. 10B is a cross-sectional view taken along line 10B-10B' of FIG. 10A.

The IC device 1000 illustrated in FIGS. 10A and 10B includes a plurality of gate recess regions GR1, GR2, and GR3. The plurality of gate recess regions GR1, GR2, and GR3 each may be disposed between a first device region DR1 and a second device region DR2 or in a region other than a device region of the IC device 100, for example, the first device region DR1 and the second device region DR2, as described with respect to the gate recess region GR with reference to FIGS. 1A through 1D.

The plurality of gate lines GL10 include a first gate portion GL11 and a second gate portion GL12 which are repeatedly alternately disposed at least two times in a length direction (the Y direction in FIGS. 10A and 10B) of the gate lines GL10. Accordingly, the gate lines GL10 each have an upper surface that has an uneven shape and extends in the length direction (the Y direction in FIGS. 10A and 10B).

More details for the first gate portion GL11 and the second gate portion GL12 are substantially similar to those described with respect to the first gate portion GL1 and the second gate portion GL2 with reference to FIGS. 1A through 1D. In addition, more details for the gate line GL10 are substantially similar to those described with respect to the gate line GL with reference to FIGS. 1A through 1D.

Figure 11:
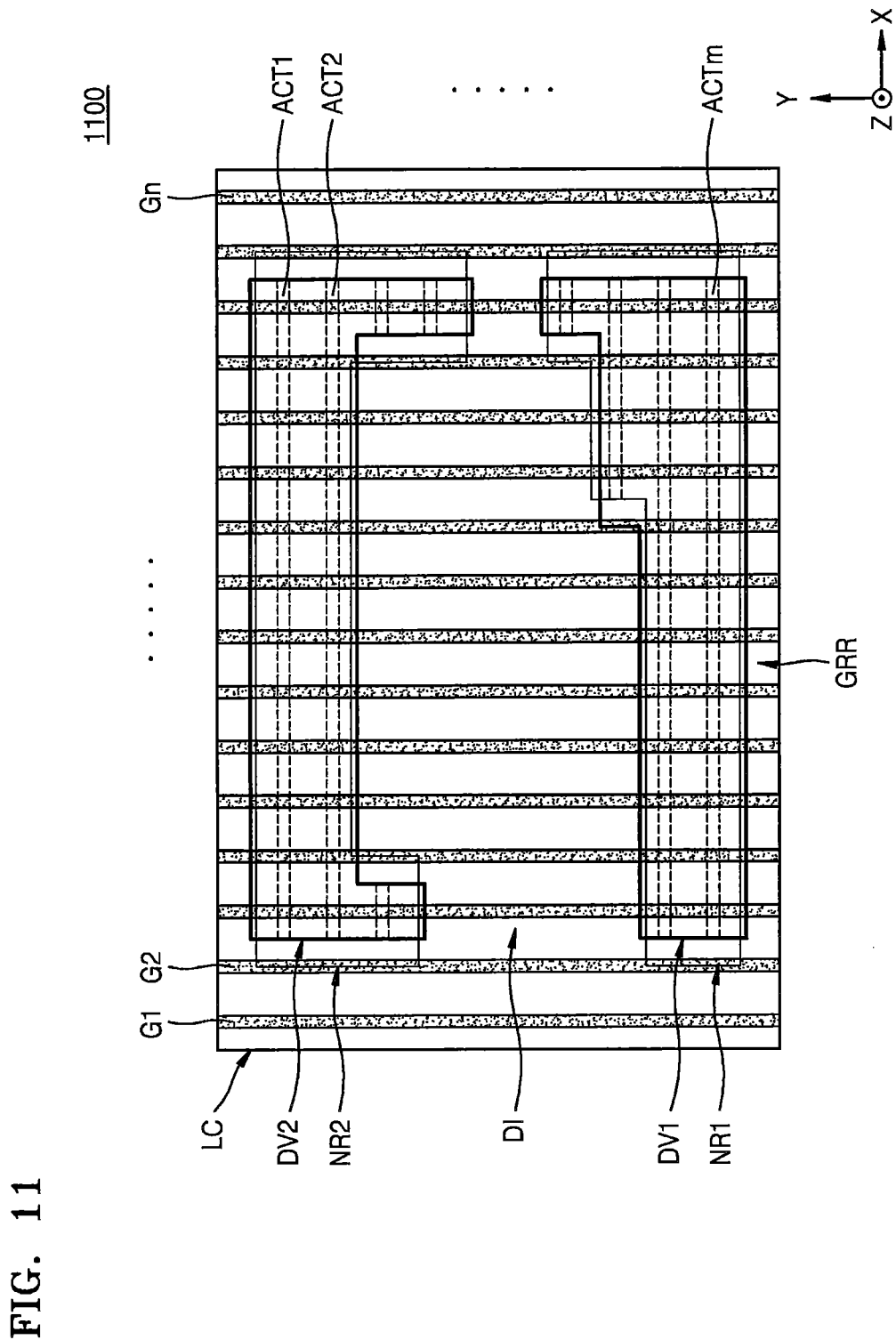
FIG. 11 is a plan view of an IC device according to other example embodiments.

FIG. 11 is a plan view of an IC device 1100 including a gate recess region GRR having various plane shapes, according to another example embodiment.

Referring to FIG. 11, the IC device 1100 may include a cell region LC.

A logic cell including transistors may be formed in the cell region LC. Each of the transistors in the cell region LC may include a gate electrode formed by a gate first process or a gate last process (referred to as a "replacement metal gate (RMG) process"). In the gate first process, a high-k dielectric layer and a metal gate may be first formed on a channel region, and then, a source/drain region may be formed in an active region at both sides of the metal gate. In the RMG process, a source/drain region may be first formed in an active region, and then, a high-k dielectric layer and a metal gate may be formed on a channel region.

In some example embodiments, various kinds of logic cells, which are standard cells performing a logical function, such as a counter, a buffer, and the like, and include a plurality of circuit elements, such as a transistor, a resistor, and the like, may be formed in the cell region LC. For example, logic cells, such as an AND gate, a NAND gate, an OR gate, a NOR gate, an exclusive OR (XOR) gate, an exclusive NOR (XNOR) gate, an inverter, an adder, a buffer, a delay, a filter, a multiplexer, an OAI (OR/AND/INVERTER) logic, an AO (AND/OR) logic, an AOI (AND/OR/INVERTER) logic, a D-type flip-flop, a reset flip-flop, a master-slaver flip-flop, a latch, and/or the like, may be formed in the cell region LC of the IC device 1100. However, the logic cells stated above are just examples, and the inventive concept is not limited thereto.

The IC device 1100 includes a plurality of device regions DV1 and DV2 having a plurality of fin-type active regions and an inter-device isolation region DI for defining the plurality of device regions DV1 and DV2. The plurality of device regions DV1 and DV2 may have the same structure as the first and second device regions DR1 and DR2 described with reference to FIGS. 1A through 1D. The inter-device isolation region DI may correspond to the deep trench region 110T described with reference to FIGS. 1A through 1D.

A plurality of active regions ACT1, ACT2, . . . , and ACTm (where m is a positive integer) are formed in each of the plurality of device regions DV1 and DV2. In some example embodiments, the plurality of active regions ACT1, ACT2, . . . , and ACTm may be formed as the fin-type active region illustrated in FIGS. 1A through 1D. In some other example embodiments, the plurality of active regions ACT1, ACT2, . . . , and ACTm may be formed as an active region that is defined by a device isolation layer formed in a bulk substrate by a shallow trench isolation process.

A plurality of gate lines G1, G2, . . . , and Gn (where n is a positive integer) extend in a direction that intersects the plurality of active regions ACT1, ACT2, . . . , and ACTm over the plurality of device regions DV1 and DV2 and the inter-device region DI. In the IC device 1100 illustrated in FIG. 11, a gate recess region GRR may be a region other than normal regions NR1 and NR2 including a plurality of device regions DV1 and DV2. First portions of each gate line G1, G2, . . . , and Gn, which are positioned in the normal regions NR1 and NR2, and a second portion of each gate line G1, G2, . . . , and Gn, which is positioned in the inter-device isolation region DI, may be connected to each other in one body. Upper surfaces of the first portions of each gate line G1, G2, . . . , and Gn, which are positioned in the normal regions NR1 and NR2, may be positioned at a level that is different from that of an upper surface of the second portion of each gate line G1, G2, . . . , and Gn, which is positioned in the inter-device isolation region DI.

The first portions of each gate line G1, G2, . . . , and Gn, which are positioned in the normal regions NR1 and NR2, may have flat upper surfaces extending at a first level LV1, similar to the first gate portion GL1 described with reference to FIGS. 1A through 1D. The second portion of each gate line G1, G2, . . . , and Gn, which is positioned in the inter-device isolation region DI, may have an upper surface having a second level LV2 that is lower than the first level LV1, similar to the second gate portion GL2 described with reference to FIGS. 1A through 1D.

In order to reduce parasitic capacitance, which may occur due to coupling between the plurality of gate lines G1, G2, . . . , and Gn and other wiring structures adjacent thereto, while maintaining electrical characteristics of transistors including the plurality of gate lines G1, G2, . . . , and Gn, the thickness of a portion of each of the plurality of gate lines G1, G2, . . . , and Gn in the gate recess region GRR may be reduced so that the level of the upper surface of the second portion which is positioned in the inter-device isolation region DI is lower than those of the upper surfaces of the first portions which are positioned in the normal regions NR1 and NR2.

The IC device 1100 illustrated in FIG. 11 may include at least some of characteristics of the above example embodiments, described with reference to FIGS. 1A through 10B.

FIGS. 12A through 21B are cross-sectional views that sequentially illustrate methods of manufacturing an IC device, according to some embodiments. More specifically, FIGS. 12A, 13A, . . . , and 21A are cross-sectional views that illustrate, according to a process sequence, a portion corresponding to a cross section taken along line 1B-1B' of FIG. 1A. FIGS. 12B, 13B, . . . , and 21B are cross-sectional views that illustrate, according to a process sequence, a portion corresponding to a cross section taken along line 1C-1C' of FIG. 1A. The method of manufacturing an IC device, according to the example embodiment, is described below with reference to FIGS. 12A through 21B.

Figure 12A:
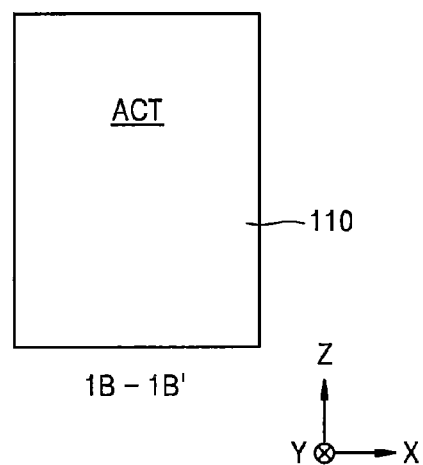
FIGS. 12A through 21B are cross-sectional views that sequentially illustrate methods of manufacturing an IC device, according to example embodiments.
Figure 12B:
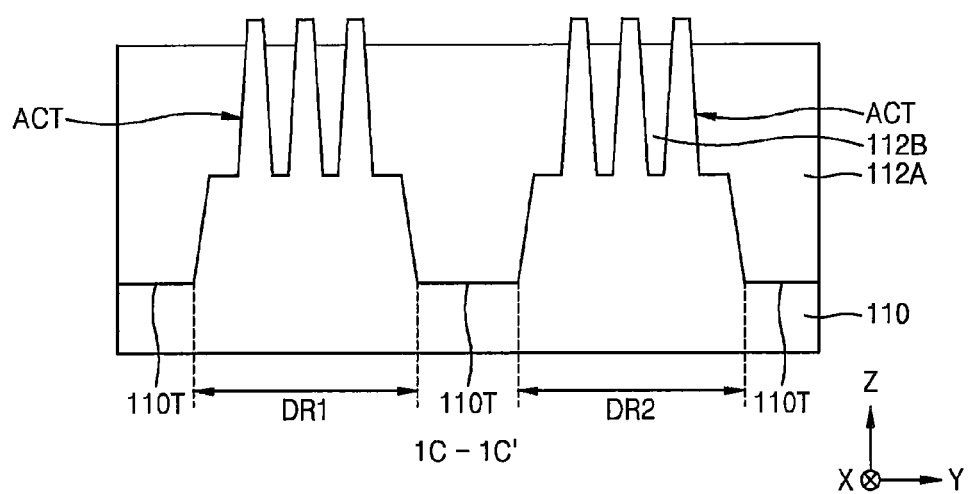

According to FIGS. 12A and 12B, a substrate 110 having a metal oxide semiconductor (MOS) region is prepared.

A plurality of fin-type active regions ACT, which protrudes from the substrate 110 upward (the Z direction) and extends in a direction (e.g., the X direction), and a deep trench region 110T, which defines first and second device regions DR1 and DR2 including the plurality of fin-type active regions ACT, are formed by etching a portion of the substrate 110.

In some example embodiments, one of the first and second device regions DR1 and DR2 may be a region for forming an NMOS transistor, and the other of the first and second device regions DR1 and DR2 may be a region for forming a PMOS transistor. However, the inventive concept is not limited thereto. For example, the first device region DR1 and the second device region DR2 each may be a region for forming any one of the NMOS and PMOS transistors.

The plurality of fin-type active regions ACT may include P-type or N-type impurity diffusion regions (not shown) according to a channel type of a MOS transistor to be formed in each of the plurality of fin-type active regions ACT.

Next, after forming an insulating layer, which covers the plurality of fin-type active regions ACT while filling the deep trench region 110T, an inter-device isolation layer 112A and a device isolation layer 112B may be formed by performing an etch-back process on the insulating layer. The plurality of fin-type active regions ACT may protrude from an upper surface of the device isolation layer 112B, and thus, protruding portions of the plurality of fin-type active regions ACT may be exposed.

The inter-device isolation layer 112A and the device isolation layer 112B each may be formed of silicon oxide, silicon nitride, silicon oxynitride, or a combination there. The inter-device isolation layer 112A and the device isolation layer 112B each may include an insulating liner (not shown) formed of thermal oxide and an insulating layer (not shown) that is formed on the insulating liner and buries the deep trench region 110T.

Figure 13A:
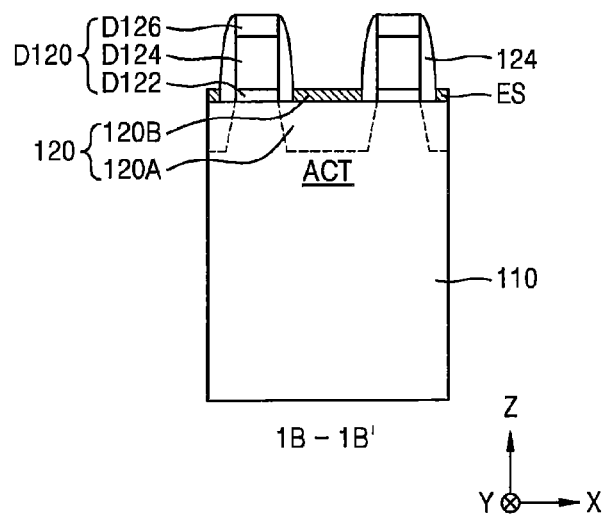
Figure 13B:
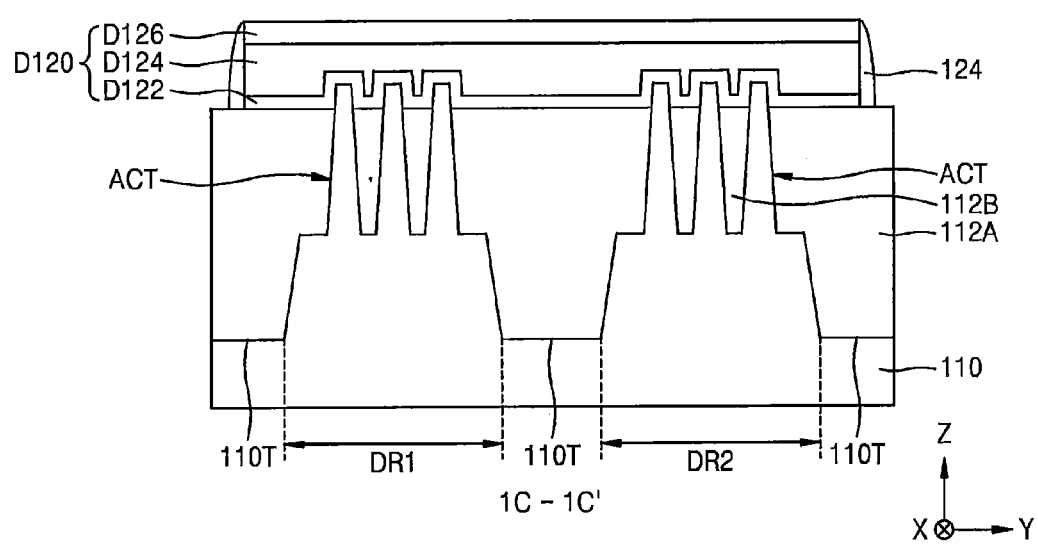

Referring to FIGS. 13A and 13B, a plurality of dummy gate structures D120, which extend on the plurality of fin-type active regions ACT while intersecting the plurality of fin-type active regions ACT, are formed.

The plurality of dummy gate structures D120 each may include a dummy gate insulating layer D122, a dummy gate line D124, and a dummy gate capping layer D126, which are sequentially stacked on the plurality of fin-type active regions ACT. In some example embodiments, the dummy gate insulating layer D122 may include silicon oxide. The dummy gate line D124 may include polysilicon. The dummy gate capping layer D126 may include at least one selected from silicon oxide, silicon nitride, and silicon oxynitride. Next, an insulating spacer 124 may be formed at both sides of each of the plurality of the dummy gate structures D120. The insulating spacer 124 is formed of silicon nitride, silicon oxynitride, or a combination thereof.

A semiconductor layer ES is formed, by an epitaxial growing process, on the plurality of fin-type active regions ACT that are exposed at the both sides of each of the plurality of the dummy gate structures D120, and a source/drain region 120 including a first source/drain region 120A and a second source/drain region 120B is formed. The first source/drain region 120A is formed in a portion of each of the plurality of fin-type active regions ACT, and the second source/drain region 120B is formed in the semiconductor layer ES formed on the plurality of fin-type active regions ACT. In some embodiments, the first source/drain region 120A may include an epitaxial layer. For example, the formation of the epitaxial layer for the first source/drain region 120A may include forming recess in a portion of each of the plurality of fin-type active regions ACT, which is at both sides of the gate line GL and filling the recess with the epitaxial layer grown by a epitaxial growing process.

The first source/drain region 120A and the second source/drain region 120B each may have a shape of an elevated source/drain region. An upper surface of the second source/drain region 120B may be at a level that is higher than that of an upper surface of the fin-type active region ACT.

In some example embodiments, the source/drain region 120 is not limited to the cross section shape illustrated in FIG. 13A. For example, the source/drain region 120 may be formed so that a cross section shape taken along a Y-Z plane has a polygon, such as a quadrangle, a pentagon, or a hexagon, a circle, or an oval.

Figure 14A:
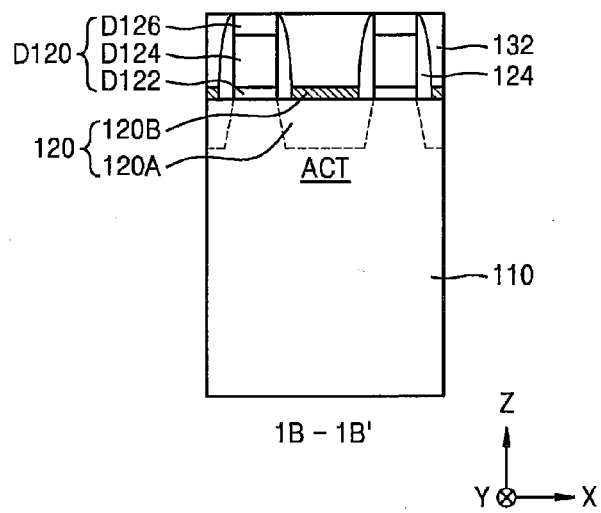
Figure 14B:
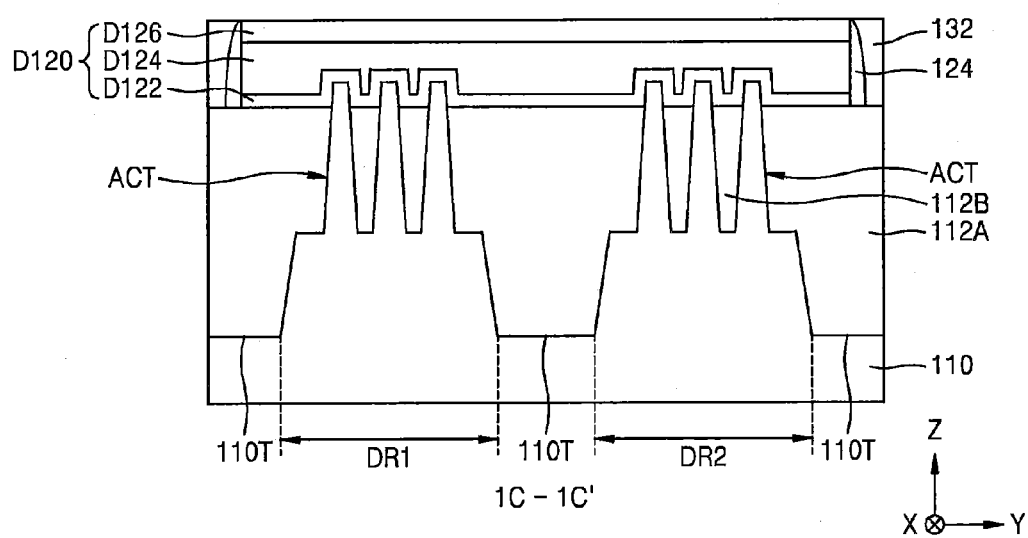

Referring to FIGS. 14A and 14B, an inter-gate insulating layer 132 is formed to cover the source/drain region 120, the plurality of dummy gate structures D120, and the insulating spacer 124.

In an example for forming the inter-gate insulating layer 132, an insulating layer, which covers sufficiently the source/drain region 120, the plurality of dummy gate structures D120, and the insulating spacer 124, may be formed. Next, the inter-gate insulating layer 132 having a flat surface may be formed by planarizing a resultant structure, in which the insulating layer has been formed, so that the plurality of dummy gate structures D120 may be exposed.

Figure 15A:
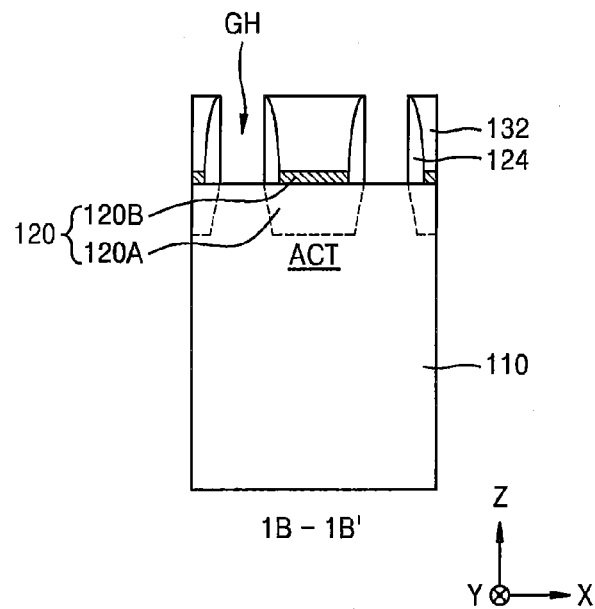
Figure 15B:
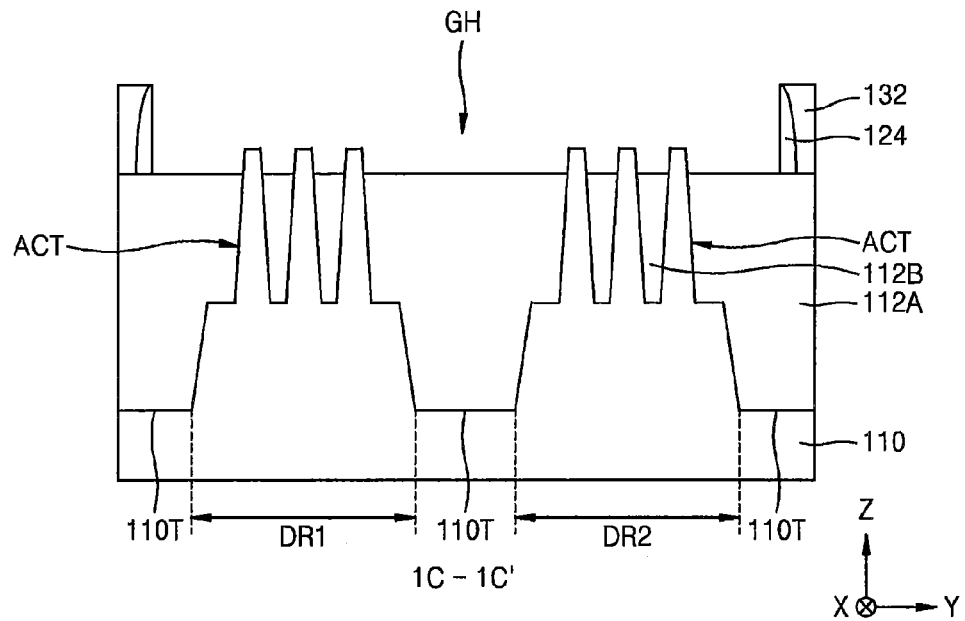

Referring to FIGS. 15A and 15B, a plurality of gate spaces GH are formed by removing the plurality of dummy gate structures D120 that are exposed through the inter-gate insulating layer 132.

The insulating spacer 124 and the fin-type active region ACT may be exposed through the plurality of gate spaces GH.

Figure 16A:
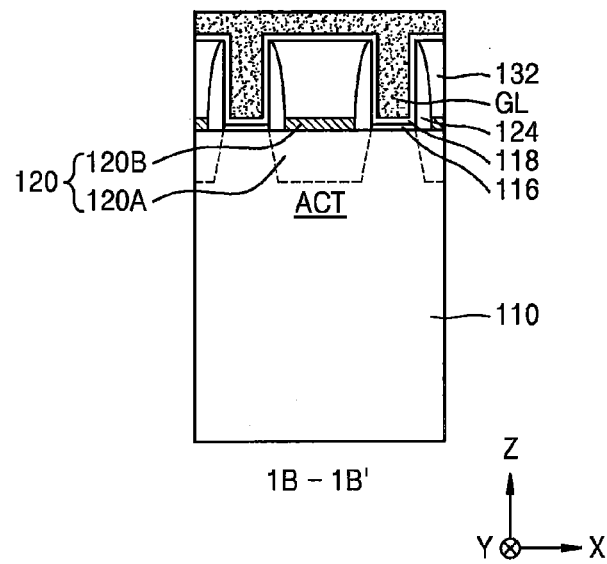
Figure 16B:
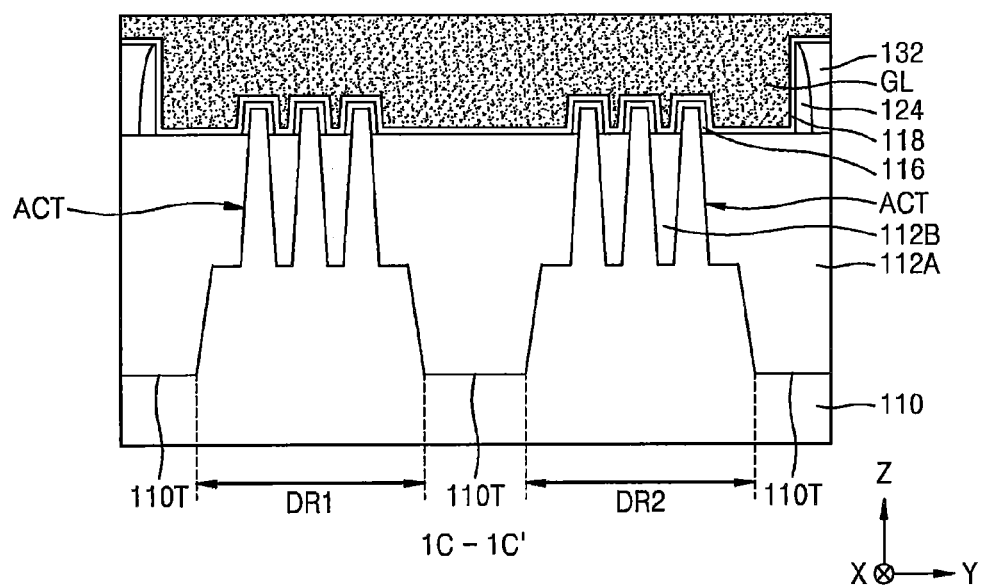

Referring to FIGS. 16A and 16B, a plurality of interface layers 116, a plurality of gate insulating layers 118, and a plurality of gate lines GL are sequentially formed in the plurality of gate spaces GH (refer to FIGS. 15A and 15B).

A process of forming the plurality of interface layers 116 may include a process of oxidizing a portion of the fin-type active region ACT, which is exposed in the plurality of gate spaces GH. The plurality of interface layers 116 may prevent an interface defect between the plurality of gate insulating layers 118, which are formed on the plurality of interface layers 116, and the fin-type active region ACT positioned under the plurality of interface layers 116. In some example embodiments, the plurality of interface layers 116 may be formed of silicon oxide, silicon oxynitride, silicate, and/or a combination thereof.

Each of the plurality of gate insulating layers 118 may include a silicon oxide layer, a high dielectric layer, and/or a combination thereof. The high dielectric layer may be formed of a material having a dielectric constant that is higher than that of the silicon oxide layer. For example, the gate insulating layer 118 may have a dielectric constant of about 10 to about 25.

Each of the plurality of gate lines GL may have a structure in which a metal nitride layer, a metal layer, a conductive capping layer, and a gap-fill metal layer are sequentially stacked.

The metal nitride layer and the metal layer each may include at least one selected from Ti, Ta, W, Ru, Nb, Mo, and Hf.

The metal nitride layer and the metal layer each may be formed by an ALD process, a metal organic ALD (MOALD) process, or a metal organic CVD (MOCVD) process.

The conductive capping layer may function as a protective layer for preventing a surface of the metal layer from being oxidized. Also, the conductive capping layer may function as a wetting layer for facilitating deposition when another conductive layer is deposited on the metal layer. The conductive capping layer may be formed of a metal nitride, e.g., TiN, TaN, and/or a combination thereof, but is not limited thereto.

The gap-fill metal layer may extend on the conductive capping layer while filling a space between each of the plurality of fin-type active regions ACT. The gap-fill metal layer may include a tungsten (W) layer. The gap-fill metal layer may be formed by an ALD process, a CVD process, or a PVD process. The gap-fill metal layer may bury, without a void, a recess space that is formed by a step portion of an upper surface of the conductive capping layer in the space between each of the plurality of fin-type active regions ACT.

Figure 17A:
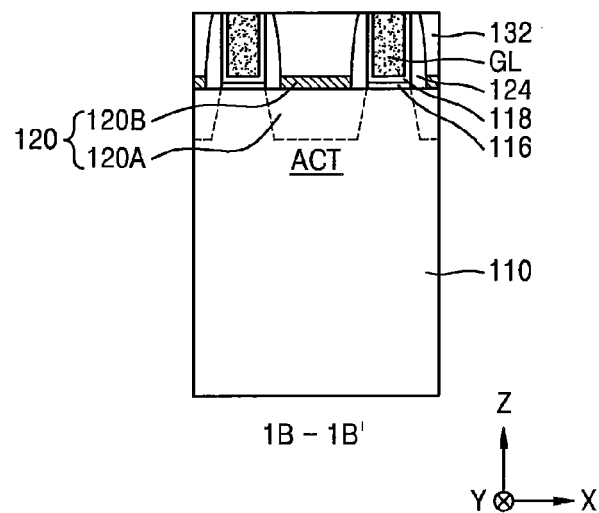
Figure 17B:
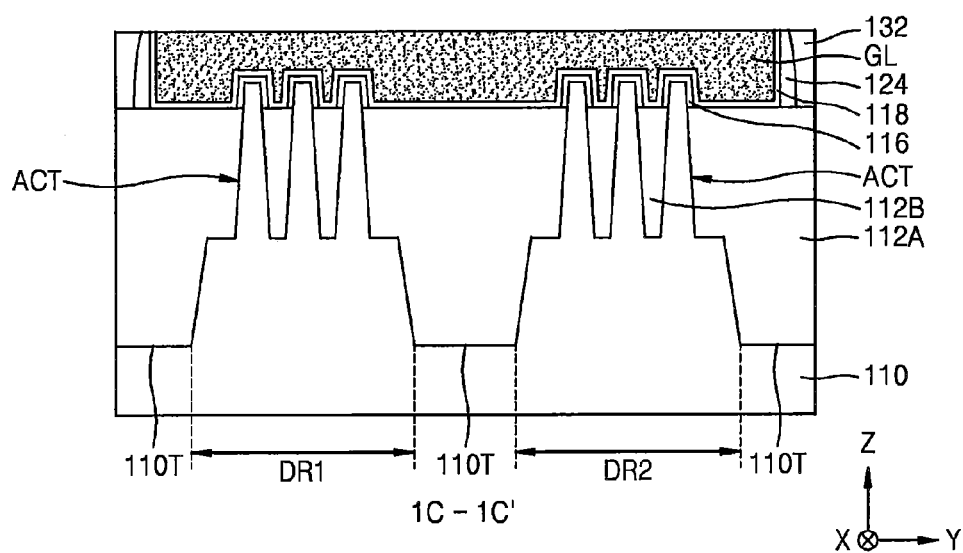

Referring to FIGS. 17A and 17B, a planarization process is performed on a resultant structure of FIGS. 16A and 16B to remove unnecessary portions so that the plurality of gate lines GL and the plurality of gate insulating layers 118 remain only in the plurality of gate spaces SH (refer to FIGS. 10A and 10B).

As a result of the planarization process, upper surfaces of the insulating spacer 124 and the inter-gate insulating layer 132 may be removed to a predetermined thickness, and thus, the thicknesses (i.e., thicknesses in the vertical direction) of the insulating spacer 124 and the inter-gate insulating layer 132 in the Z direction may be decreased, and upper surfaces of the plurality of gate insulating layers 118, upper surfaces of the plurality of insulating spacers 124, and an upper surface of the inter-gate insulating layer 132 may be exposed around upper surfaces of the plurality of gate lines GL.

Figure 18A:
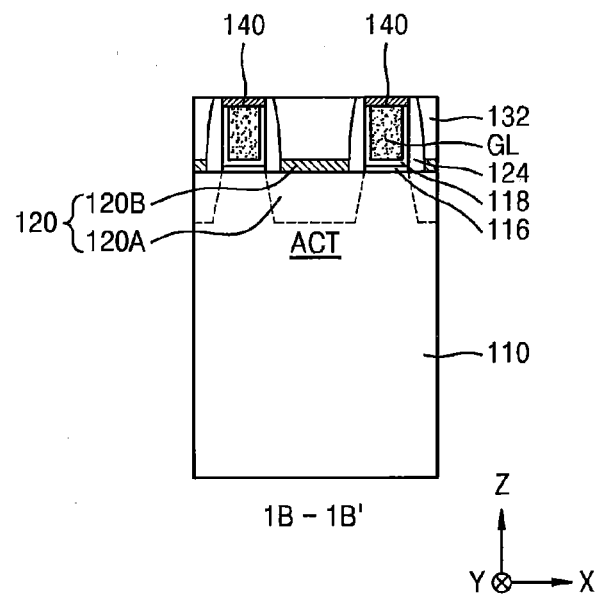
Figure 18B:
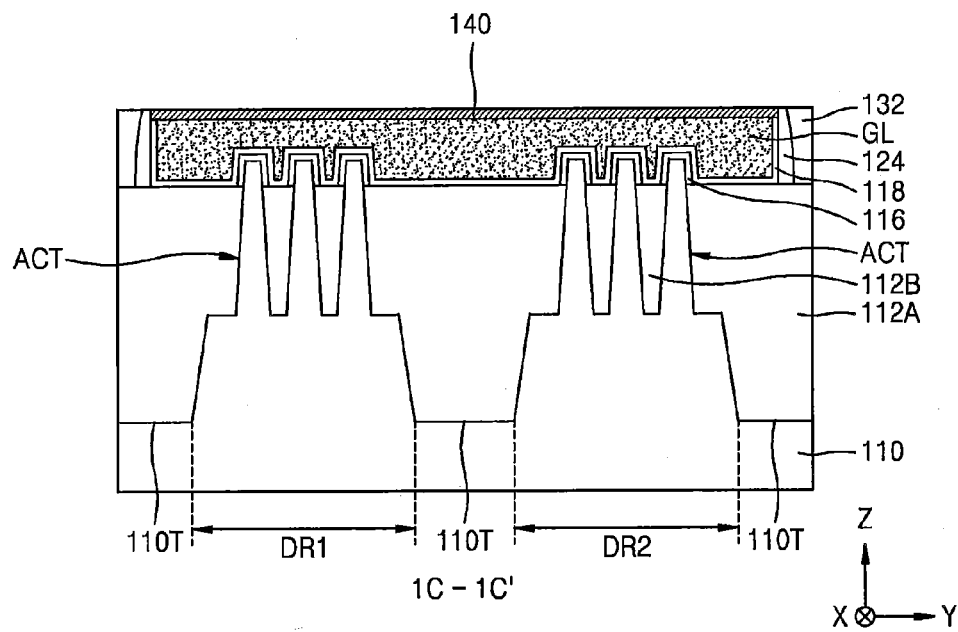

Referring to FIGS. 18A and 18B, after preparing a capping space, which is a portion of the gate space GH, on each of the plurality of gate lines GL by removing upper portions of the plurality of gate lines GL, an insulating capping layer 140 is formed by filling the capping space with an insulating material. The insulating capping layer 140 may be formed to have a flattened upper surface.

Figure 19A:
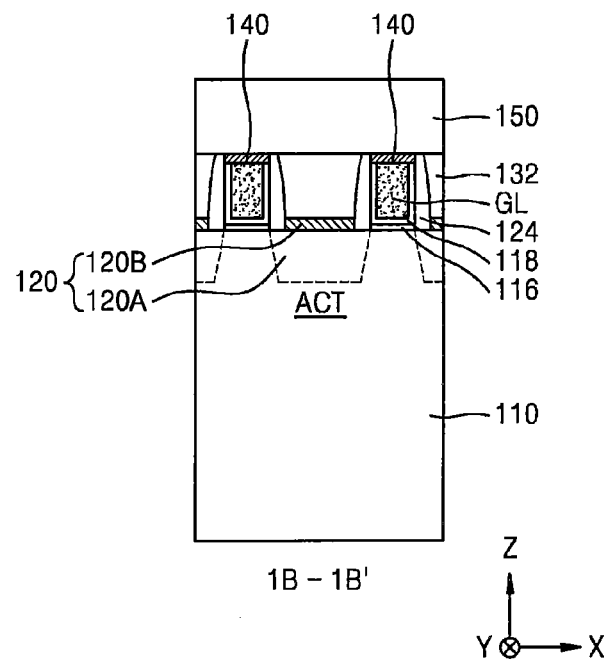
Figure 19B:
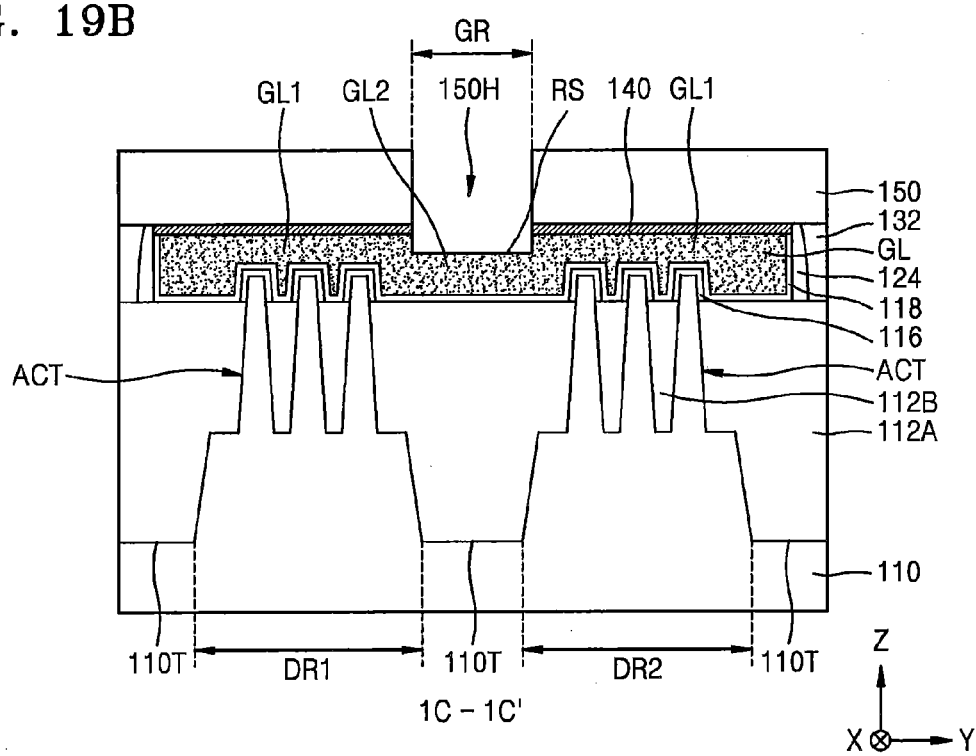

Referring to FIGS. 19A and 19B, a mask pattern 150 in which an opening 150H having a shape corresponding to the gate recess region GR has been formed is formed on the insulating capping layer 140 and the inter-gate insulating layer 132. An upper surface of the insulating capping layer 140 in the gate recess region GR may be exposed through the opening 150H.

In some example embodiments, the mask pattern 150 may be formed of a material that may provide etch selectivity with respect to the gate lines GL. For example, the mask pattern 150 may be formed of any one selected from oxide, nitride, polysilicon, spin on hardmask (SOH), an amorphous carbon layer (ACL), photoresist, and/or a combination thereof, but is not limited thereto. The mask pattern 150 may be formed by using various kinds of materials according to the material of the insulating capping layer 140 and the material of the gate line GL.

Next, portions of the insulating capping layer 140 and gate line GL in the gate recess region GR, exposed through the opening 150H, are removed by using the mask pattern 150 as an etch mask, and thus, a second gate portion GL2 having a reduced thickness is formed. The second gate portion GL2 may have a recessed upper surface RS that is positioned at a level that is lower than an upper surface of the gate line GL. A portion of the gate line, covered with the mask pattern 150, on the first device region DR1 and the second device region DR2 may remain as a first gate portion GL1.

In some example embodiments, while removing the portion of the gate line GL, exposed through the opening 150H, by using the mask pattern 150 as an etch mask, a portion of the gate insulating layer 118 and/or a portion of the insulating spacer 124, which are/is exposed together with the gate line GL through the opening 150H, may also be simultaneously or sequentially removed.

Any one of the IC devices 100, 100A, 100B, 200, 300, 400, 500, and 600 described with reference to FIGS. 1A through 6C may be formed by performing appropriate subsequent processes, depending on whether a process of removing a portion of the gate insulating layer 118 and/or a portion of the insulating spacer 124 is included in the manufacturing method, whether the insulating capping layer 140 described with reference to FIGS. 18A and 18B is formed or omitted, whether a process of forming the first and second insulating capping layers 440 and 442 described with reference to FIGS. 4A through 4C instead of the insulating capping layer 140 is performed, or whether a process of forming the insulating capping layer 642 described with reference to FIGS. 6A through 6C instead of the insulating capping layer 140 is performed.

Figure 20A:
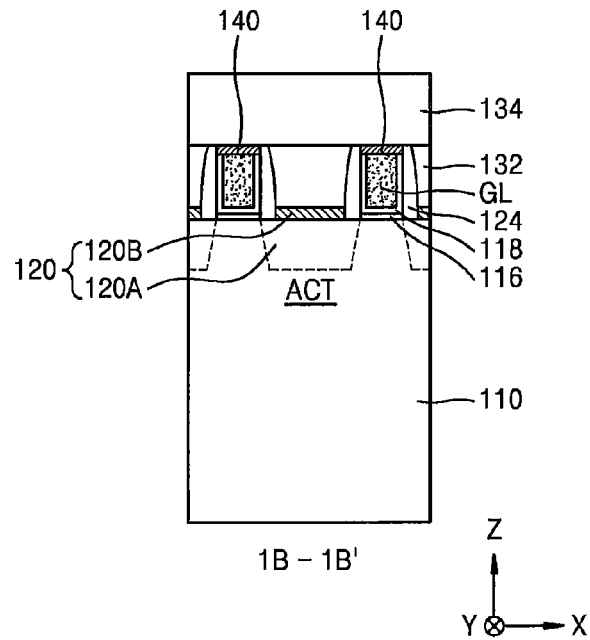
Figure 20B:
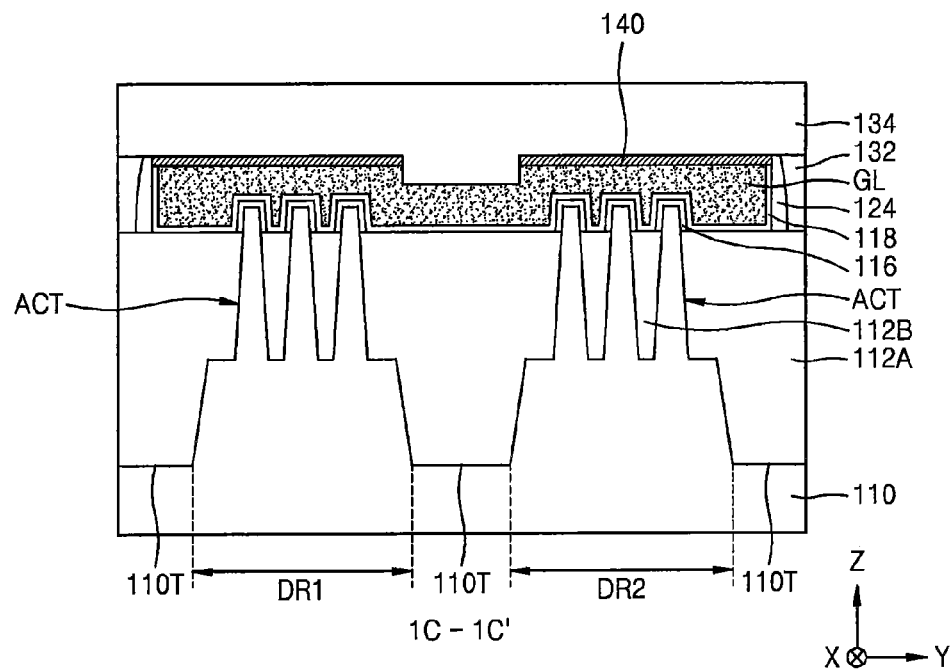

Referring to FIGS. 20A and 20B, an interlayer insulating layer 134 is formed to cover a structure, which includes the gate line GL and the inter-gate insulating layer 132, after removing the mask pattern 150 (refer to FIGS. 19A and 19B).

In some example embodiments, a deposition process having a relatively degraded step coverage may be performed by controlling a deposition condition of an insulating material for the formation of the interlayer insulating layer 132 while forming the interlayer insulating layer 134, unlike in FIGS. 20A and 20B, and thus, the IC device 700, which includes an air space region AS as described with reference to FIGS. 7B and 7C between the second gate portion GL2 of the gate line GL and the interlayer insulating layer 134 on the deep trench region 110T, may be formed.

In some example embodiments, the interlayer insulating layer 134 may be formed of oxide, nitride, or a combination thereof. For example, the interlayer insulating layer 134 may include an oxide layer, a nitride layer, and/or a combination thereof. For example, the interlayer insulating layer 134 may include an HDP oxide layer.

Figure 21A:
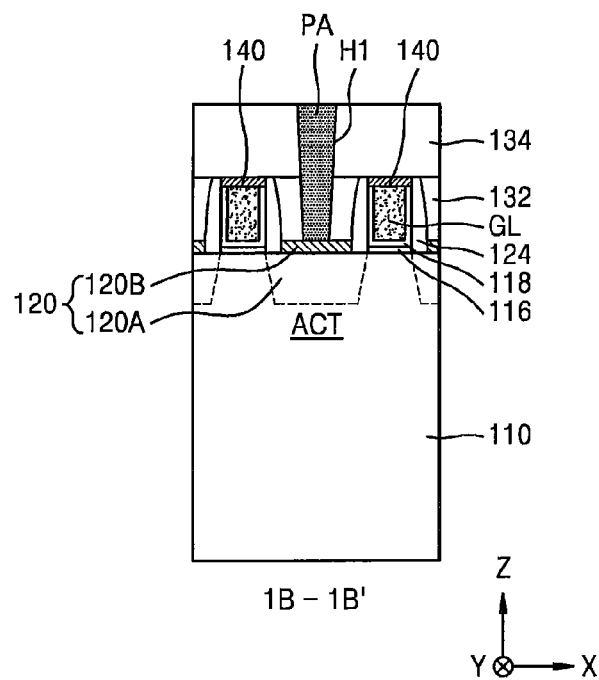
Figure 21B:
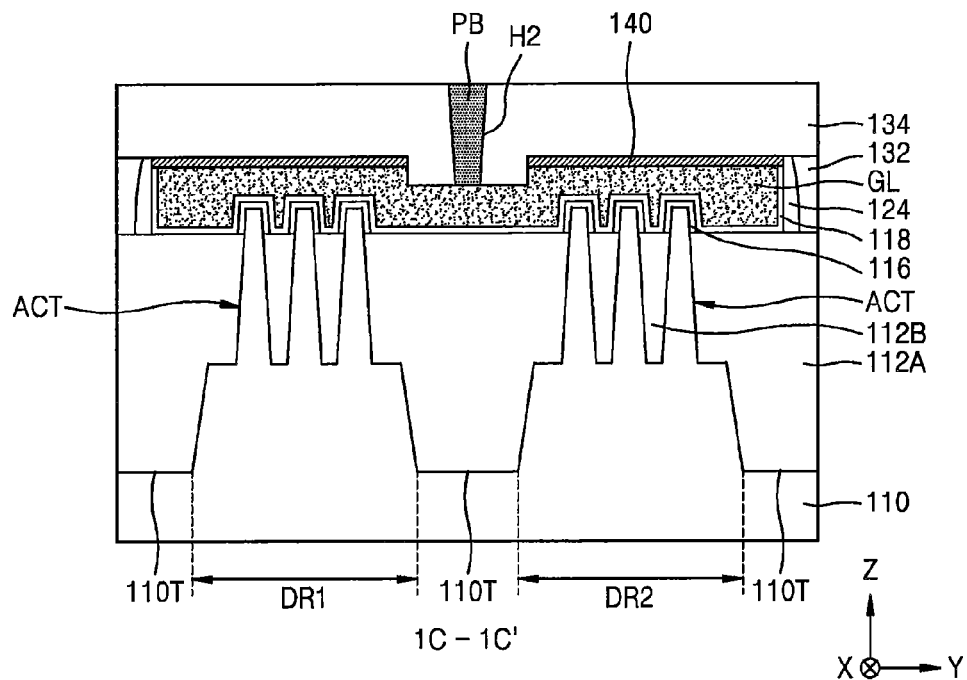

Referring to FIGS. 21A and 21B, a portion of the interlayer insulating layer 134 and a portion of the inter-gate insulating layer 132 are removed, and thus, a first contact hole H1 for exposing the source/drain region 120 and a second contact hole H2 for exposing the gate line GL are formed.

Next, the first contact hole H1 and the second contact hole H2 are filled with a conductive material, and thus, a first contact plug PA, which is connected to the source/drain region 120, and a second contact plug PB, which is connected to the gate line, are formed.

Although not illustrated in drawings, the first contact plug PA may be formed on a metal silicide layer after forming the metal silicide layer on a surface of the source/drain region 120, which is exposed through the first contact hole H1, before forming the first contact plug PA in the first contact hole H1, to thereby manufacture the IC device 100 illustrated in FIGS. 1A through 1D.

In some example embodiments, the second contact plugs PB8A and PB8B illustrated in FIGS. 8A through 8C may be formed instead of the second contact plug PB to thereby manufacture the IC device 800 illustrated in FIGS. 8A through 8C.

In some example embodiments, the second contact plug PB9 illustrated in FIG. 9 may be formed instead of the second contact plug PB to thereby manufacture the IC device 900 illustrated in FIG. 9.

In some example embodiments, a mask pattern, in which a plurality of openings for exposing the gate line GL in the plurality of gate recess regions GR1, GR2, and GR3 illustrated in FIG. 10B have been formed, may be formed instead of the mask pattern 150 described with reference to FIGS. 19A and 19B, the insulating capping layer 140, gate line GL, gate insulating layer 118, and insulating spacer 124 may be etched as much as required by using the mask pattern as an etch mask, and subsequent processes may be performed to thereby manufacture the IC device 1000 illustrated in FIG. 10.

Although IC devices, which include a FinFET having a 3D structure channel, and a method of manufacturing the IC devices have been described above with reference to FIGS. 12A through 21B, the inventive concept is not limited thereto. For example, IC devices including a planar MOSFET having characteristics according to the inventive concept and a method of manufacturing the IC devices may be provided through various modifications and changes.

Figures 22, 23A:
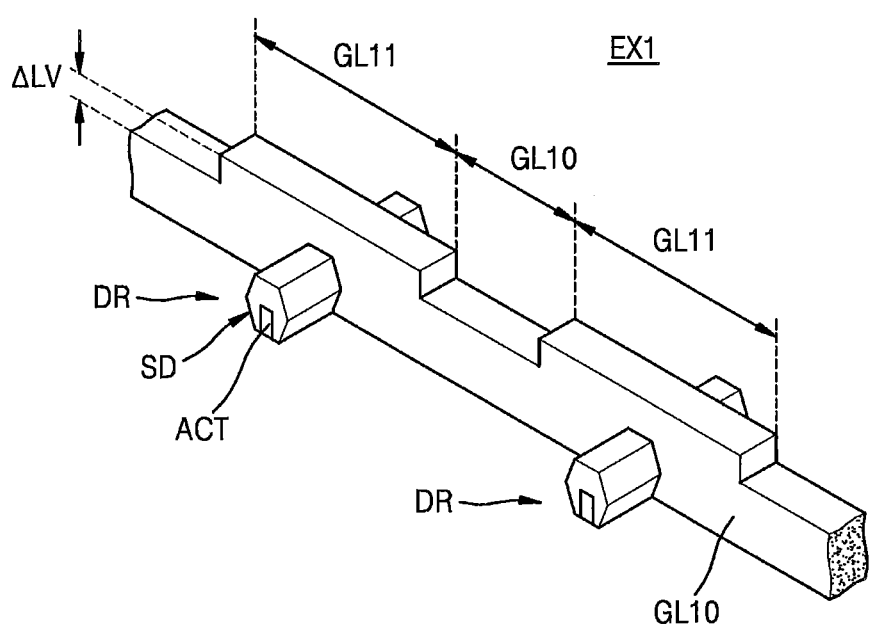
FIG. 22 is a table showing evaluation results for AC gains of transistors based on a level difference between upper surfaces of first and second gate portions of a gate line in an IC device according to some example embodiments.
FIGS. 23A through 23C are diagrams illustrating structures of IC device samples used for evaluation of FIG. 22.

FIG. 22 is a table showing evaluation results for AC gains of transistors based on a level difference between upper surfaces of first and second gate portions of a gate line in an IC device according to an example embodiment.

More specifically, with respect to the gate line GL10 of the IC device 1000 illustrated in FIGS. 10A and 10B or an IC device according to an example embodiment, which has a similar structure to the IC device 1000, AC gains of transistors are evaluated based on a level difference $\Delta LV$ between an upper surface of the first gate portion GL11 and an upper surface of the second gate portion GL12.

Figure 23B:
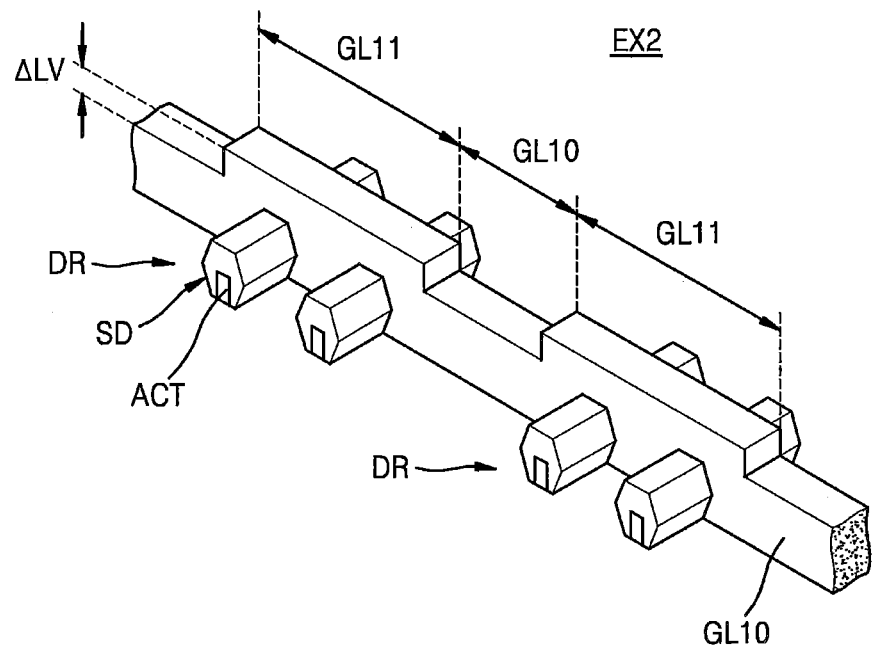
Figure 23C:
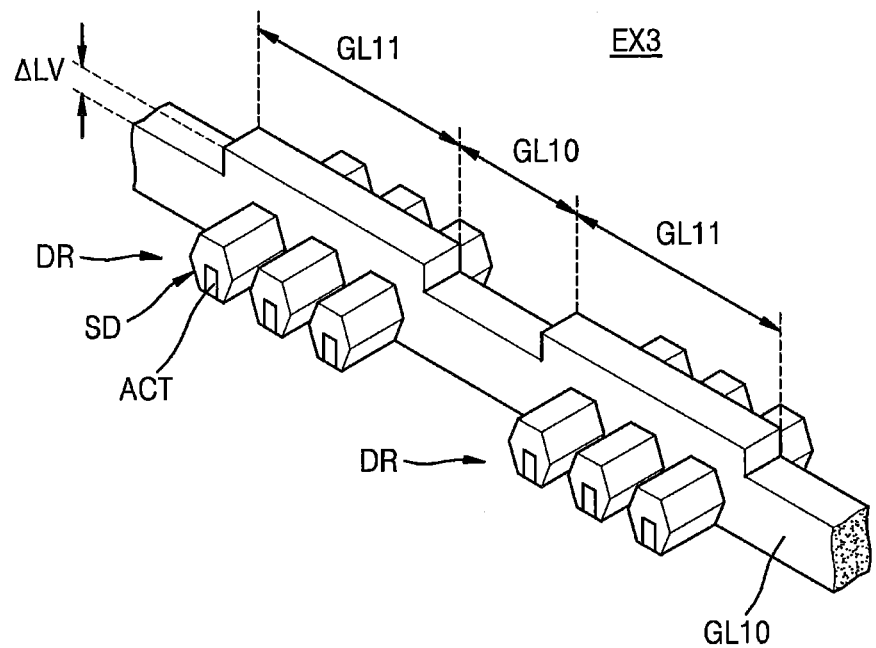

In order to perform the evaluation of AC gains, IC device samples EX1, EX2, and EX3 each including a FinFET, which include one, two, and three fin-type active regions ACT in an device region DR, as illustrated in FIGS. 23A, 23B, and 23C, respectively, and in which source/drain regions SD are formed in each fin-type active region ACT at both sides of a gate line GL10, are manufactured. With respect to each of the IC device samples EX1, EX2, and EX3 illustrated in FIGS. 23A, 23B, and 23C, AC gains of transistors are evaluated when a level difference $\Delta LV$ in the Z direction between an upper surface of the first gate portion GL11 and an upper surface of the second gate portion GL12 is 30 nm, 45 nm, and 60 nm in the Z direction.

Referring to the evaluation results of FIG. 22, as the number of fin-type active regions ACT in the device region DR decreases and the level difference $\Delta LV$ in the Z direction increases, an AC gain is improved.

Figure 24:
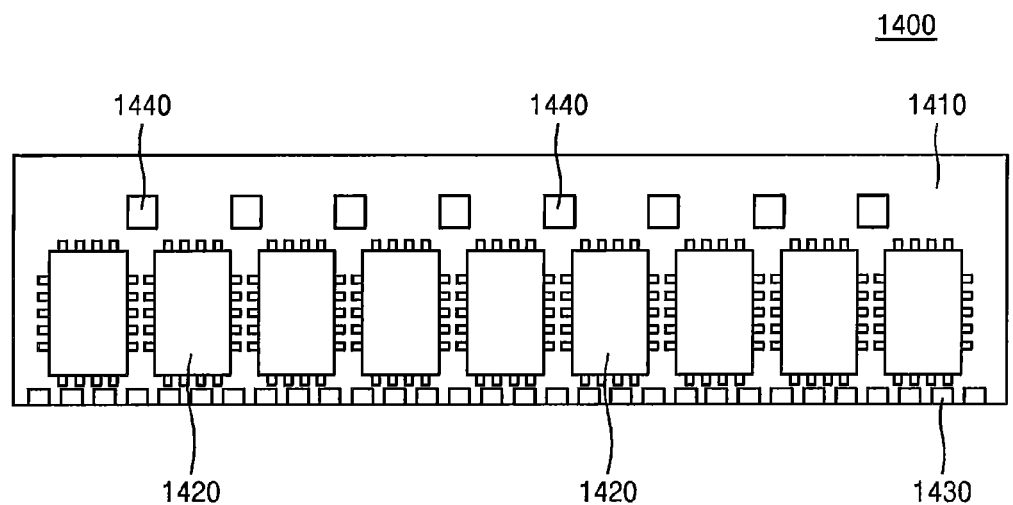
FIG. 24 is a plan view of a memory module according to example embodiments.

FIG. 24 is a plan view of a memory module 1400 according to an example embodiment.

The memory module 1400 includes a module substrate 1410 and a plurality of semiconductor chips 1420 attached on the module substrate 1410.

Each of the plurality of semiconductor chips 1420 includes a semiconductor device according to an example embodiment as disclosed herein. That is, each of the plurality of semiconductor chips 1420 includes at least one selected from the IC devices 100, 100A, 100B, 200, 300, 400, 500, 600, 700, 800, 900, 1000, and 1100 illustrated in FIGS. 1 through 11, the IC device samples EX1, EX2, and EX3 illustrated in FIGS. 23A through 23C, and IC devices modified and changed therefrom.

A connection unit 1430 that may be inserted into a socket of a mother board is disposed at one side of the module substrate 1410. A ceramic decoupling capacitor 1440 is disposed on the module substrate 1410. The memory module 1400 is not limited to a configuration illustrated in FIG. 24 and may be manufactured in various forms.

Figure 25:
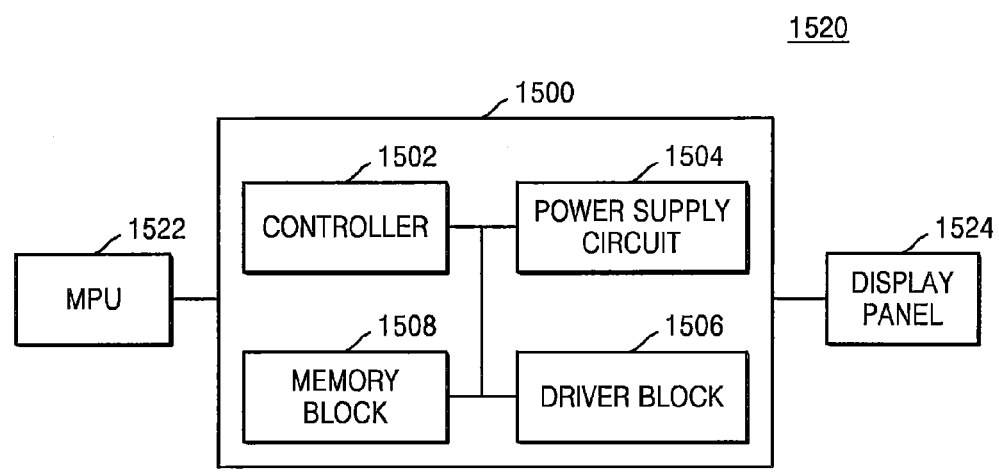
FIG. 25 is a block diagram of a display apparatus including a display driver IC (DDI) according to example embodiments.

FIG. 25 is a block diagram of a display apparatus 1520 including a display driver IC (DDI) 1500 according to an example embodiment.

Referring to FIG. 25, the DDI 1500 may include a controller 1502, a power supply circuit 1504, a driver block 1506, and a memory block 1508. The controller 1502 receives a command applied from a main processing unit (MPU) 1522 and decodes the received command, and controls blocks of the DDI 1500 to implement an operation according to the command. The power supply circuit 1504 generates a driving voltage in response to the control of the controller 1502. The driver block 1506 drives a display panel 1524 by using the driving voltage generated by the power supply circuit 1504 in response to the control of the controller 1502. The display panel 1524 may be a liquid crystal display panel or a plasma display panel. The memory block 1508 may be a block that temporarily stores a command input from the controller 1502 and control signals output from the controller 1502 or stores data. The memory block 1508 may include a memory, such as RAM, ROM, or the like. At least one selected from the power supply circuit 1504 and the driver block 1506 includes at least one selected from the IC devices 100, 100A, 100B, 200, 300, 400, 500, 600, 700, 800, 900, 1000, and 1100 illustrated in FIGS. 1 through 11, the IC device samples EX1, EX2, and EX3 illustrated in FIGS. 23A through 23C, and IC devices modified and changed therefrom.

Figure 26:
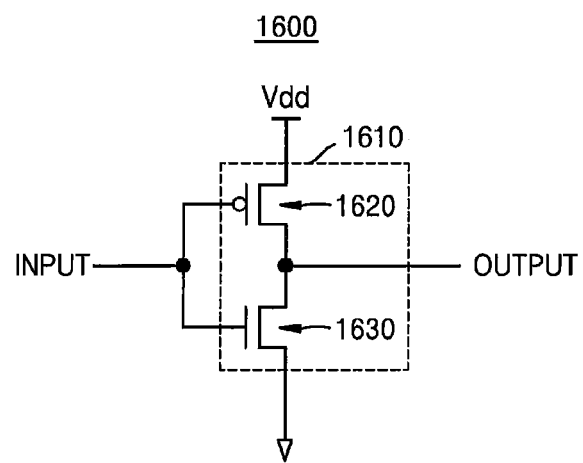
FIG. 26 is a circuit diagram of a complementary metal-oxide-semiconductor (CMOS) inverter according to example embodiments.

FIG. 26 is a circuit diagram of a CMOS inverter 1600 according to an example embodiment.

The CMOS inverter 1600 includes a CMOS transistor 1610. The CMOS transistor 1610 includes a PMOS transistor 1620 and an NMOS transistor 1630, connected between a power supply terminal Vdd and a ground terminal. The CMOS transistor 1610 includes at least one selected from the IC devices 100, 100A, 100B, 200, 300, 400, 500, 600, 700, 800, 900, 1000, and 1100 illustrated in FIGS. 1 through 11, the IC device samples EX1, EX2, and EX3 illustrated in FIGS. 23A through 23C, and IC devices modified and changed therefrom.

Figure 27:
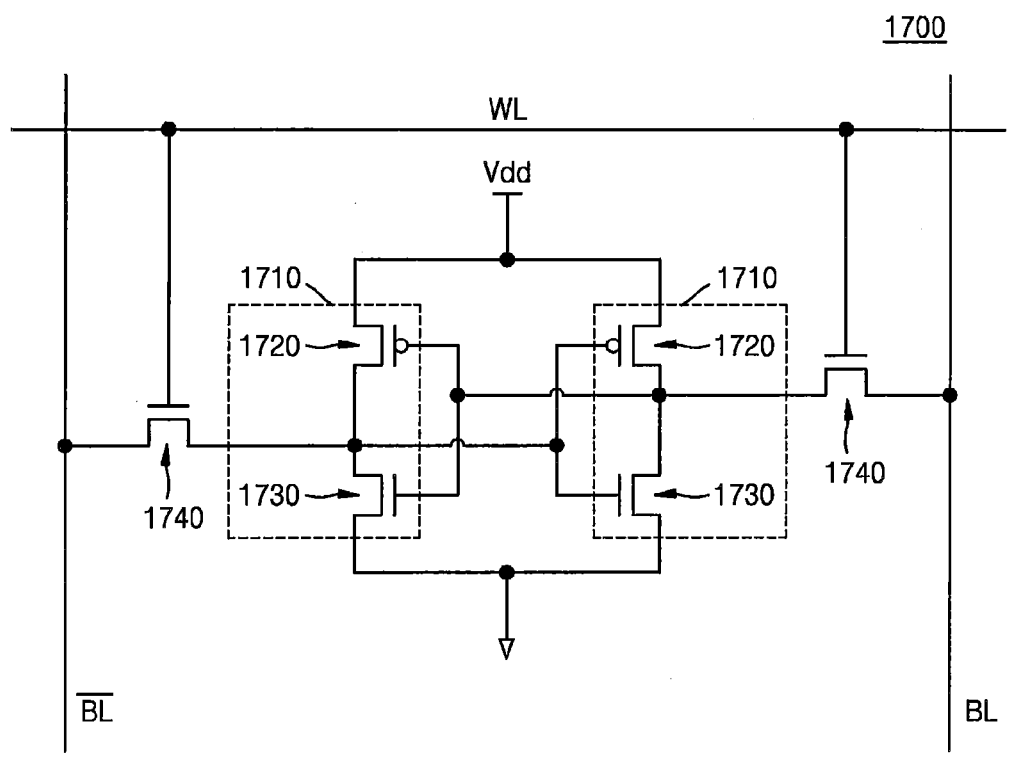
FIG. 27 is a circuit diagram of a CMOS static random-access memory (SRAM) device according to example embodiments.

FIG. 27 is a circuit diagram of a CMOS SRAM device 1700 according to an example embodiment.

The CMOS SRAM device 1700 includes a pair of driving transistors 1710. Each of the pair of driving transistors 1710 includes a PMOS transistor 1720 and an NMOS transistor 1730, connected between a power supply terminal Vdd and a ground terminal. The CMOS SRAM device 1700 further includes a pair of transfer transistors 1740. The source of the transfer transistor 1740 is connected to a common node between the PMOS transistor 1720 and the NMOS transistor 1730, which form the driving transistor 1710. The source of the transfer transistor 1740 is connected to a common node between the PMOS transistor 1720 and the NMOS transistor 1730, which form the driving transistor 1710. The power supply terminal Vdd is connected to the source of the PMOS transistor 1720, and the ground terminal is connected to the source of the NOMS transistor 1730. A word line WL is connected to the gates of the pair of transfer transistors 1740, and a bit line BL and a complementary bit line /BL are connected to the drain of one of the pair of transfer transistors 1740 and the drain of the other of the pair of transfer transistors 1740, respectively.

At least one selected from the driving transistor 1710 and the transfer transistor 1740 in the CMOS SRAM device 1700 includes at least one selected from the IC devices 100, 100A, 100B, 200, 300, 400, 500, 600, 700, 800, 900, 1000, and 1100 illustrated in FIGS. 1 through 11, the IC device samples EX1, EX2, and EX3 illustrated in FIGS. 23A through 23C, and IC devices modified and changed therefrom.

Figure 28:
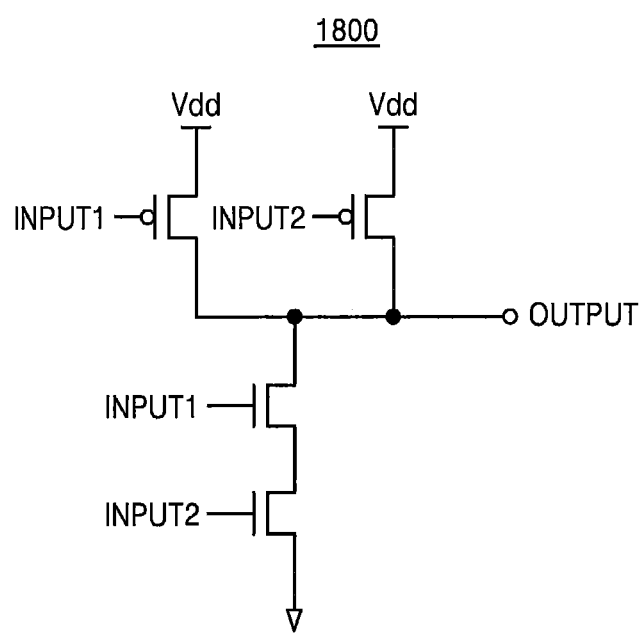
FIG. 28 is a circuit diagram of a CMOS NAND circuit according to example embodiments.

FIG. 28 is a circuit diagram of a CMOS NAND circuit 1800 according to an example embodiment.

The CMOS NAND includes a pair of CMOS transistors to which different input signals INPUT1 and INPUT2 are applied. The CMOS NAND circuit 1800 includes at least one selected from the IC devices 100, 100A, 100B, 200, 300, 400, 500, 600, 700, 800, 900, 1000, and 1100 illustrated in FIGS. 1 through 11, the IC device samples EX1, EX2, and EX3 illustrated in FIGS. 23A through 23C, and IC devices modified and changed therefrom.

Figure 29:
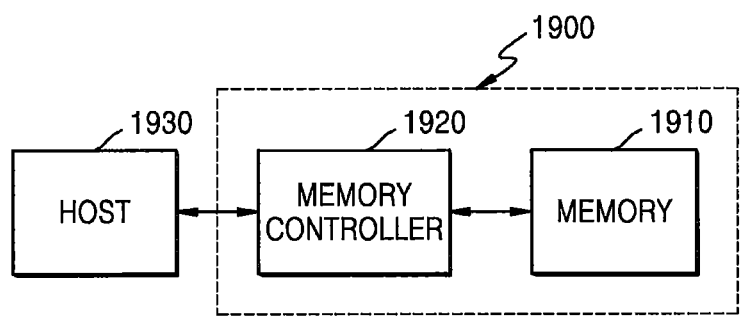
FIG. 29 is a block diagram of an electronic system according to example embodiments.

FIG. 29 is a block diagram of an electronic system 1900 according to an example embodiment.

The electronic system 1900 includes a memory 1910 and a memory controller 1920. The memory controller 1920 controls the memory 1910 to read data from the memory 1910 and/or write data to the memory 1910 in response to a request of a host 1930. At least one selected from the memory 1910 and the memory controller 1920 includes at least one selected from the IC devices 100, 100A, 100B, 200, 300, 400, 500, 600, 700, 800, 900, 1000, and 1100 illustrated in FIGS. 1 through 11, the IC device samples EX1, EX2, and EX3 illustrated in FIGS. 23A through 23C, and IC devices modified and changed therefrom.

Figure 30:
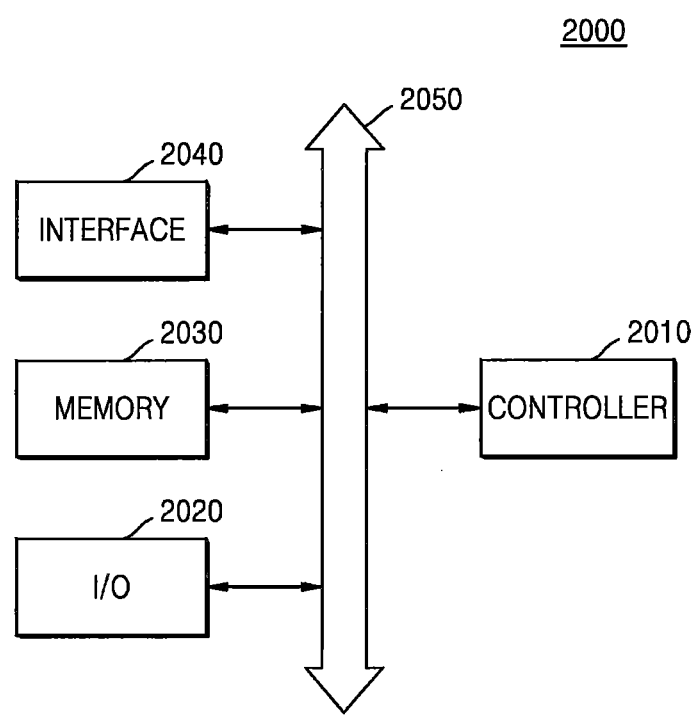
FIG. 30 is a block diagram of an electronic system according to other example embodiments.

FIG. 30 is a block diagram of an electronic system 2000 according to another example embodiment.

The electronic system 2000 includes a controller 2010, an input/output (I/O) device 2020, a memory 2030, and an interface 2040, which are connected to one another via a bus 2050.

The controller 2010 may include at least one selected from a microprocessor, a digital signal processor, and a processing device that is similar thereto. The I/O device 2020 may include at least one selected from a keypad, a keyboard, and a display. The memory 2030 may be used for storing a command that is executed by the controller 2010. For example, the memory 2030 may be used for storing user data.

The electronic system 2000 may be configured as an apparatus that may transmit and/or receive information under a wireless communication apparatus and/or a wireless environment. In some embodiments of the electronic system 2000, the interface 2040 may be configured as a wireless interface to transmit and/or receive data through a wireless communication network. The interface 2040 may include an antenna and/or a wireless transceiver. In some example embodiments, the electronic system 2000 may be used for a communication interface protocol of a third generation communication system, such as a code division multiple access (CDMA) system, a global system for mobile communications (GSM), a north American digital cellular (NADC) system, an extended-time division multiple access (E-TDMA) system, and/or a wide band code division multiple access (WCDMA) system. The electronic system 2000 includes at least one selected from the IC devices 100, 100A, 100B, 200, 300, 400, 500, 600, 700, 800, 900, 1000, and 1100 illustrated in FIGS. 1 through 11, the IC device samples EX1, EX2, and EX3 illustrated in FIGS. 23A through 23C, and IC devices modified and changed therefrom.

While the inventive concept has been particularly shown and described with reference to example embodiments thereof, it will be understood that various changes in form and details may be made therein without departing from the spirit and scope of the following claims.

What is claimed is:

1. An integrated circuit (IC) device comprising:
   a substrate comprising a device region having at least one fin-type active region and a deep trench region for defining the device region;
   a gate line that extends, in a direction intersecting the at least one fin-type active region, on the device region and the deep trench region; and
   an inter-device isolation layer that fills the deep trench region,
   wherein the gate line comprises:
   a first gate portion that extends on the device region to cover the at least one fin-type active region and has a flat upper surface at a first level; and
   a second gate portion that extends on the deep trench region to cover the inter-device isolation layer while being integrally connected to the first gate portion and has an upper surface at a second level that is closer to the substrate than the first level.

2. The IC device of claim 1, wherein the deep trench region is spaced apart from the at least one fin-type active region.

3. The IC device of claim 1, further comprising a device isolation layer that covers a lower portion of the at least one fin-type active region on the device region,
   wherein the first gate portion has a first thickness on the device isolation layer on the device region, and the second gate portion has a second thickness that is smaller than the first thickness on the inter-device isolation layer on the deep trench region.

4. The IC device of claim 1, further comprising an insulating capping layer that covers the gate line,
   wherein the insulating capping layer extends discontinuously to cover the first gate portion of the gate line and not to cover the second gate portion of the gate line.

5. The IC device of claim 1, further comprising an insulating spacer that covers both sidewalls of the gate line on the device region and the deep trench region,
   wherein the insulating spacer has a first height on the device region and has a second height that is smaller than the first height on the deep trench region.

6. The IC device of claim 1, further comprising a gate insulating layer that covers a bottom and both sidewalls of the gate line on the device region and the deep trench region,
   wherein an upper surface of the gate insulating layer is at a level that is different from a level of an upper surface of the second gate portion, on the deep trench region.

7. The IC device of claim 1, further comprising:
   a gate insulating layer that covers a bottom and both sidewalls of the gate line on the device region and the deep trench region; and
   an insulating spacer that covers both sidewalls of the gate line with the gate insulating layer interposed therebetween on the device region and the deep trench region, wherein an upper surface of the gate insulating layer on the deep trench region is positioned at a lower level than an upper surface of the insulating spacer on the deep trench region.

8. The IC device of claim 7, wherein the insulating spacer has a first height on the device region and has a second height that is smaller than the first height on the deep trench region.

9. The IC device of claim 7, further comprising a first insulating capping layer that extends discontinuously on the gate line to cover the first gate portion of the gate line and not to cover the second gate portion of the gate line,
wherein the insulating spacer covers both sidewalls of the gate line and both sidewalls of the first insulating capping layer, on the device region and the deep trench region.

10. The IC device of claim 9, further comprising a second insulating capping layer,
wherein the second insulating capping layer comprises:
a first portion that is spaced apart from the first gate portion with the first insulating capping layer interposed therebetween on the device region; and
a second portion that is integrally connected to the first portion and that contacts the second gate portion on the deep trench region.

11. The IC device of claim 1, further comprising an insulating spacer that covers both sidewalls of the gate line on the device region and the deep trench region,
wherein a height of the insulating spacer on the device region is the same as a height of the insulating spacer on the deep trench region.

12. The IC device of claim 11, further comprising an inter-gate insulating layer that covers both sidewalls of the gate line with the insulating spacer interposed therebetween on the device region and the deep trench region,
wherein an upper surface of the insulating spacer is positioned at a level that is the same as a level of an upper surface of the inter-gate insulating layer, on the deep trench region.

13. The IC device of claim 1, further comprising an insulating capping layer,
wherein the insulating capping layer comprises:
a first portion that contacts the first gate portion on the device region; and
a second portion that is integrally connected to the first portion and that contacts the second gate portion on the deep trench region.

14. The IC device of claim 1, further comprising:
an interlayer insulating layer that covers the gate line on the device region and the deep trench region; and
an air space region that is between the second gate portion and the interlayer insulating layer.

15. The IC device of claim 1, wherein the first gate portion and the second gate portion in the gate line are repeatedly alternately disposed at least two times in a length direction of the gate line, and the gate line has an upper surface that has an uneven shape and extends in the length direction of the gate line.

16. An integrated circuit (IC) device comprising:
a substrate comprising a device region having at least one active region and a first device isolation layer for defining the device region;
a second device isolation layer on the device region and covering a lower portion of the active region;
a plurality of conductive lines that cover the active region on the second device isolation layer and that extend over the device region and the first device isolation layer in a direction intersecting the active region, at least one of the plurality of conductive lines comprising a first portion that extends on the device region to cover the active region and the second device isolation layer and has a first thickness on the second device isolation layer and a second portion that extends on the first device isolation layer, while being integrally connected to the first portion and has a second thickness that is smaller than the first thickness, on the first device isolation layer; and
a first contact plug that is formed on the at least one of the plurality of conductive lines and is connected to the second portion.

17. The IC device of claim 16, further comprising a second contact plug that is formed on the at least one of the plurality of conductive lines and is connected to the first portion,
wherein the at least one of the plurality of conductive lines is a gate line for forming a transistor, and
wherein a height of the first contact plug is greater than a height of the second contact plug.

18. The IC device of claim 16, wherein each of the plurality of conductive lines has a bottom surface that evenly extends over the first device isolation layer, and an upper surface that has an uneven shape and extends in a length direction of the conductive lines.

19. The IC device of claim 16, wherein each of the plurality of conductive lines comprises a conductive line recess region that is spaced apart from the device region, and
wherein the second portion of the at least one of the plurality of conductive lines is at a position corresponding to the conductive line recess region.

20. The IC device of claim 16, further comprising:
an insulating layer that covers a bottom and both sidewalls of the at least one of the plurality of conductive lines on the device region and the first device isolation layer; and
an insulating spacer that covers both sidewalls of the at least one of the plurality of conductive lines with the insulating layer interposed therebetween on the device region and the first device isolation layer,
wherein a height of an upper surface of the insulating layer that is adjacent the second portion of the at least one of the plurality of conductive lines on the first device isolation layer is smaller than a height of an upper surface of the insulating spacer that is adjacent the first portion of the at least one of the plurality of conductive lines on the second device isolation layer.

21. The IC device of claim 20, further comprising a first insulating capping layer that extends discontinuously on the at least one of the plurality of conductive lines to cover the first portion of the at least one of the plurality of conductive lines and not to cover the second portion of the at least one of the plurality of conductive lines,
wherein the insulating spacer covers both sidewalls of the at least one of the plurality of conductive lines and both sidewalls of the first insulating capping layer, on the device region.

22. The IC device of claim 16, wherein the first contact plug has a sidewall that contacts the first portion and a bottom that contacts the second portion.

* * * * *